United States Patent
Hashimoto et al.

[11] Patent Number: 6,069,038
[45] Date of Patent: May 30, 2000

[54] METHOD OF MANUFACTURING A SEMICONDUCTOR INTEGRATED CIRCUIT DEVICE

[75] Inventors: Takashi Hashimoto, Iruma; Kenichi Kuroda, Tachikawa; Shoji Shukuri, Koganei, all of Japan

[73] Assignee: Hitachi, Ltd., Tokyo, Japan

[21] Appl. No.: 09/393,623

[22] Filed: Sep. 10, 1999

[30] Foreign Application Priority Data

Sep. 11, 1998 [JP] Japan .................................. 10-258936

[51] Int. Cl.[7] .................. H01L 21/8242; H01L 21/8244
[52] U.S. Cl. .......................... 438/241; 438/235; 438/396; 438/238; 438/258; 390/390; 390/393
[58] Field of Search ..................................... 438/253, 387, 438/254, 247, 251, 396, 241, 258, 238; 257/393, 390, 68, 71, 67, 306

[56] References Cited

U.S. PATENT DOCUMENTS 5,792,696  8/1998  Kim et al. ............................... 438/258
6,004,841  12/1999  Chang et al. ........................... 438/238
6,008,084  8/1998  Sung ...................................... 438/241

Primary Examiner—Charles Bowers
Assistant Examiner—Hsien Ming Lee
Attorney, Agent, or Firm—Antonelli, Terry, Stout & Kraus, LLP

[57] ABSTRACT

A silicon nitride film is left behind on only regions for forming the gate electrodes (word lines) of memory-cell selecting MISFETs constituting a DRAM, and it is not left behind on either of the gate electrodes of MISFETs constituting a logic LSI and those of MISFETs constituting the memory cells of an SRAM. Thereafter, the gate electrodes (word lines) in the DRAM and the gate electrodes in the logic LSI and the SRAM are simultaneously patterned by etching which employs the silicon nitride film and a photoresist film as a mask. Thus, in the manufacture of a semiconductor integrated circuit device wherein both the DRAM and the logic LSI are mounted, a contact hole forming process (gate-SAC) for the DRAM is made compatible with a contact hole forming process (L-SAC).

36 Claims, 30 Drawing Sheets

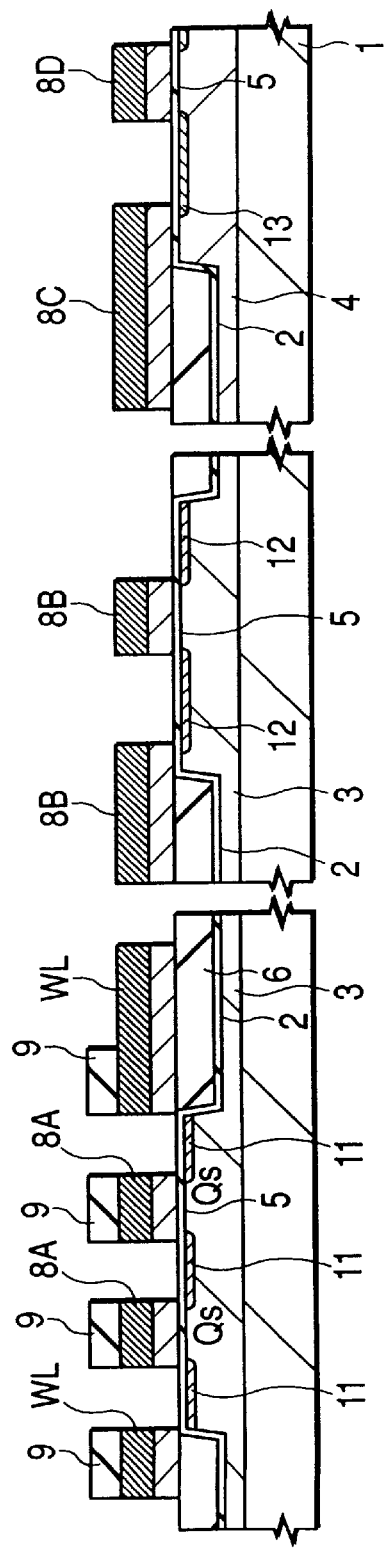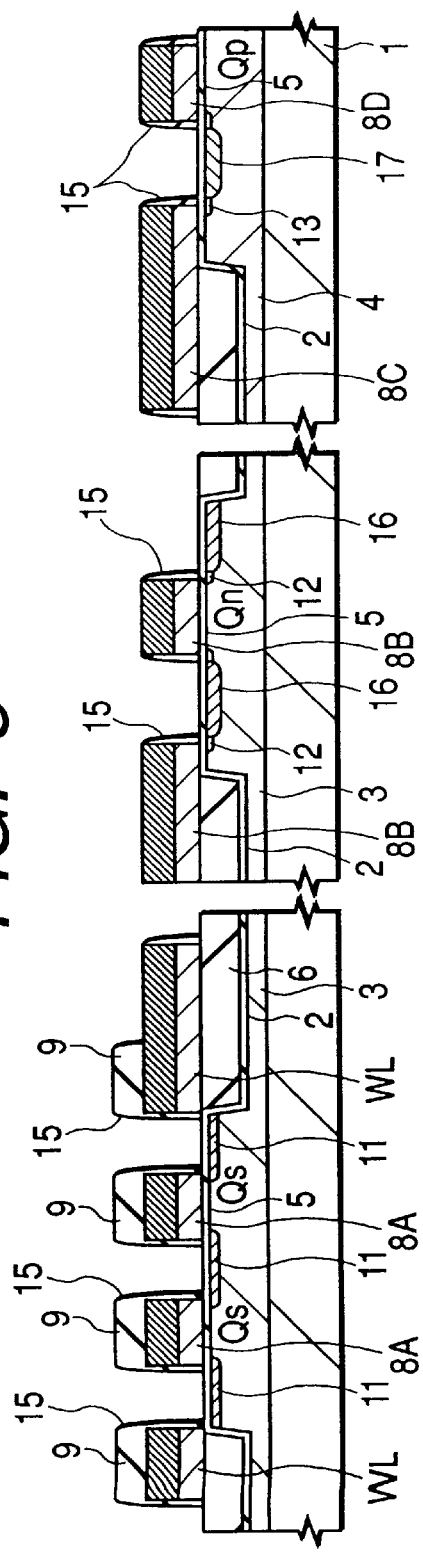

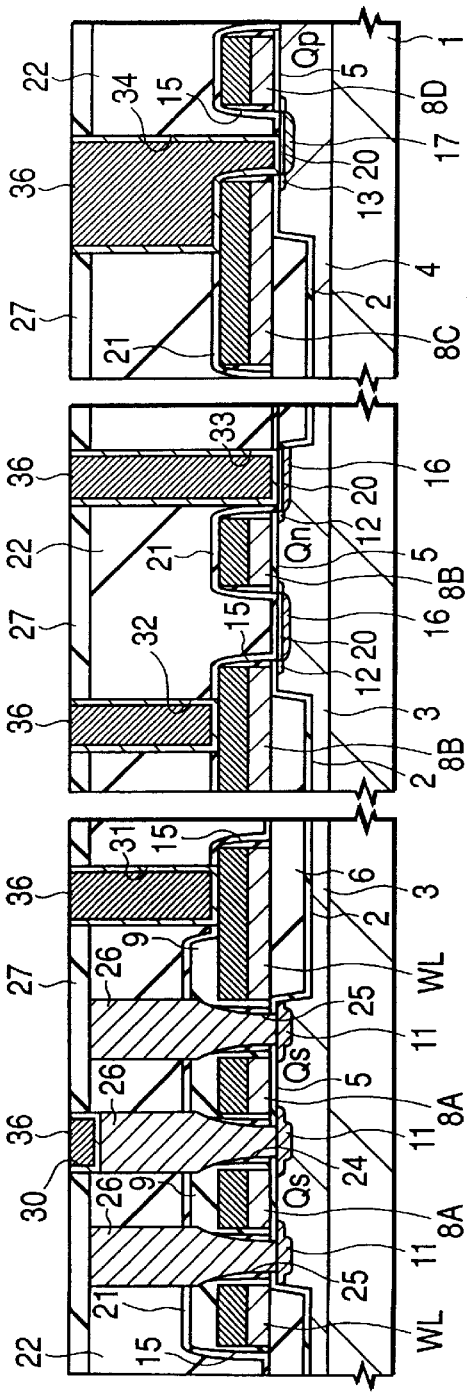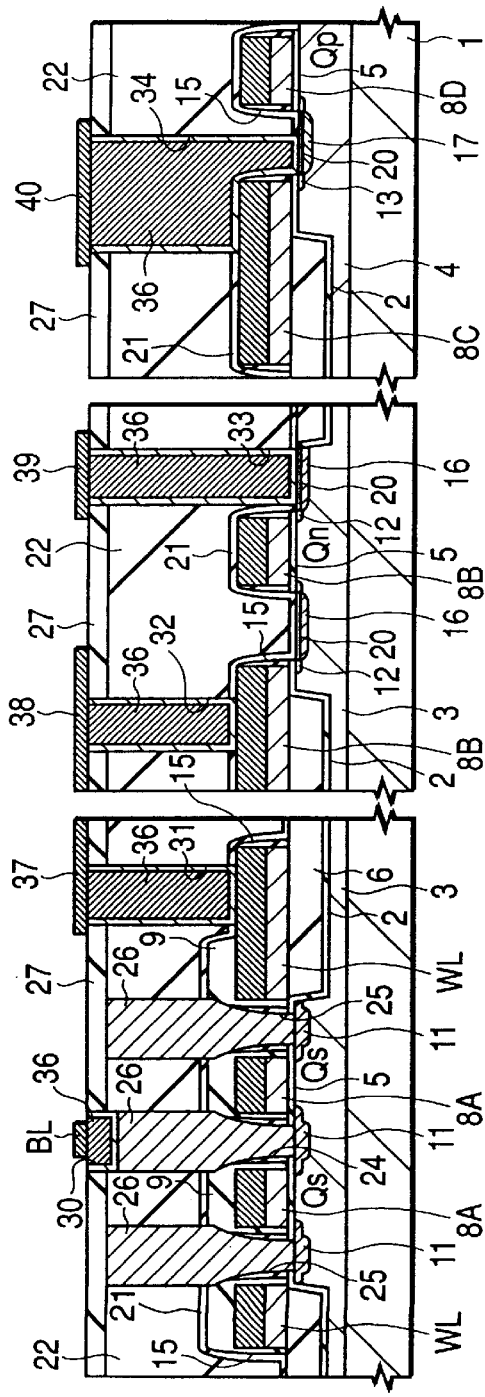

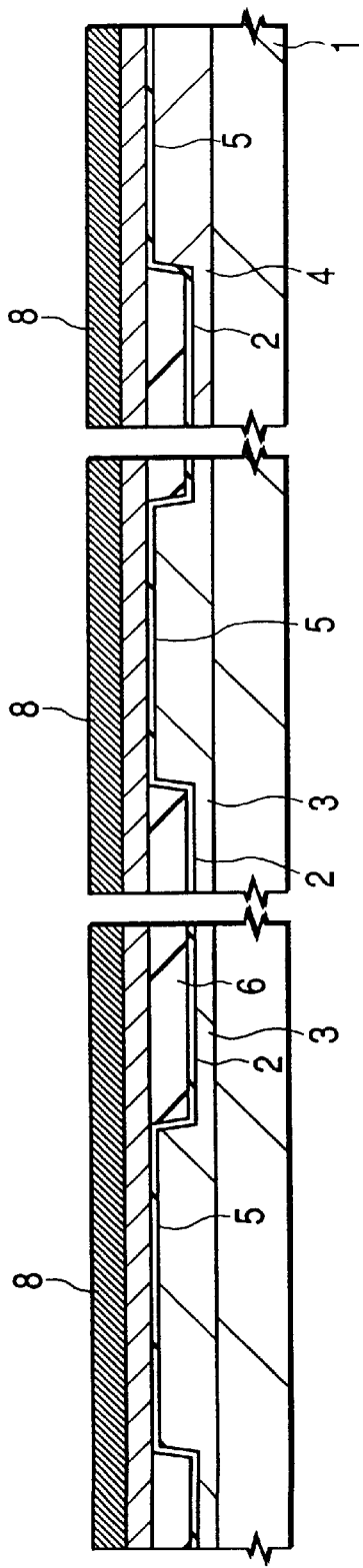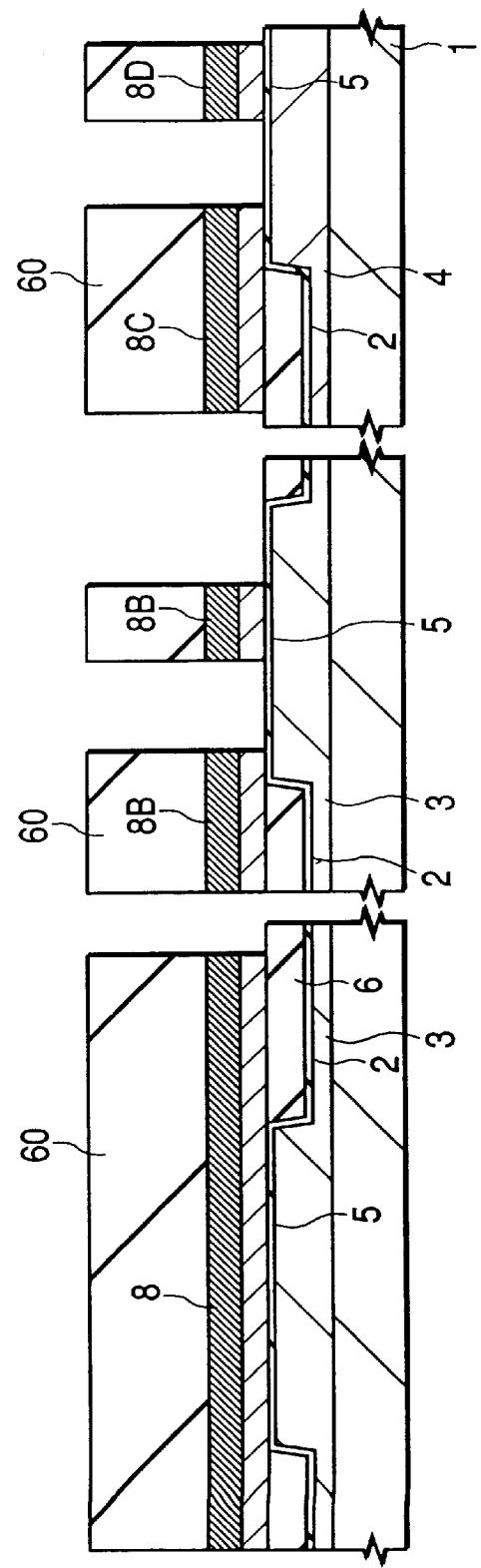

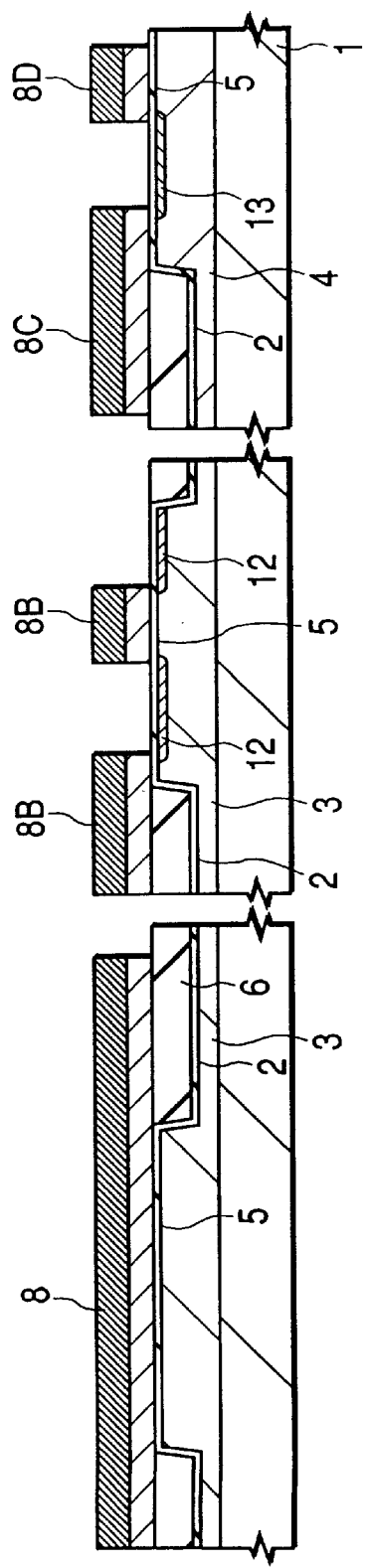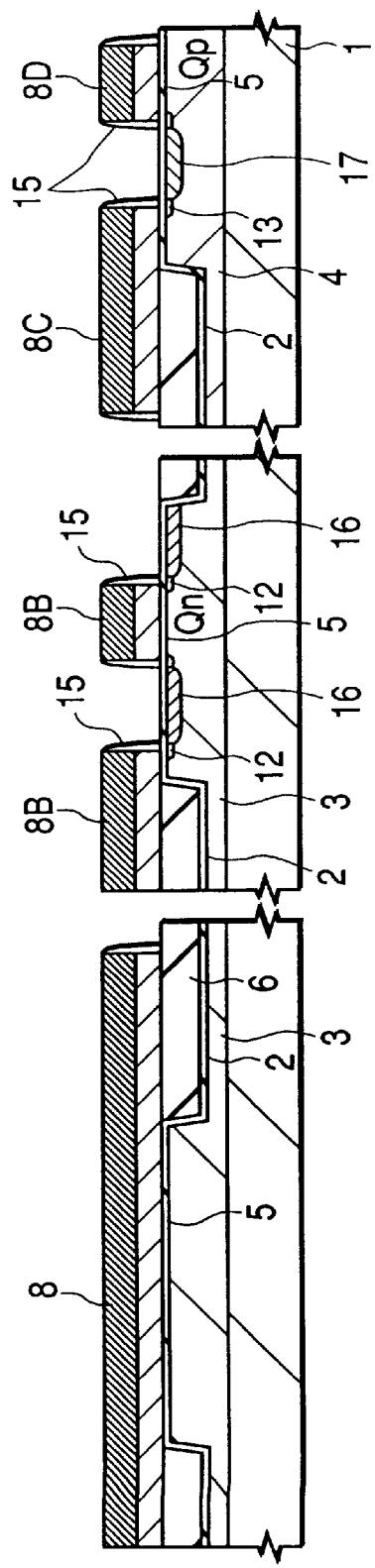

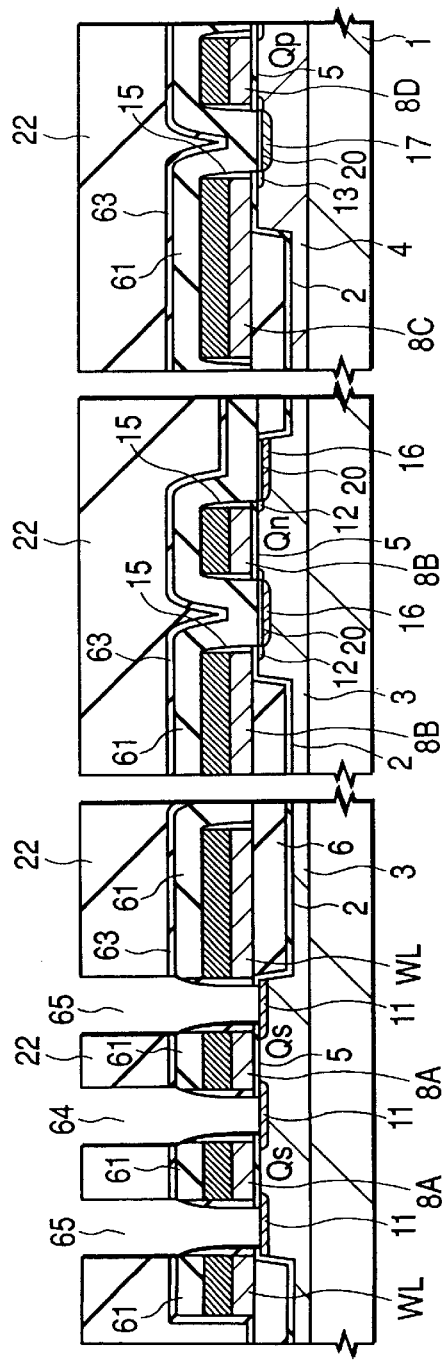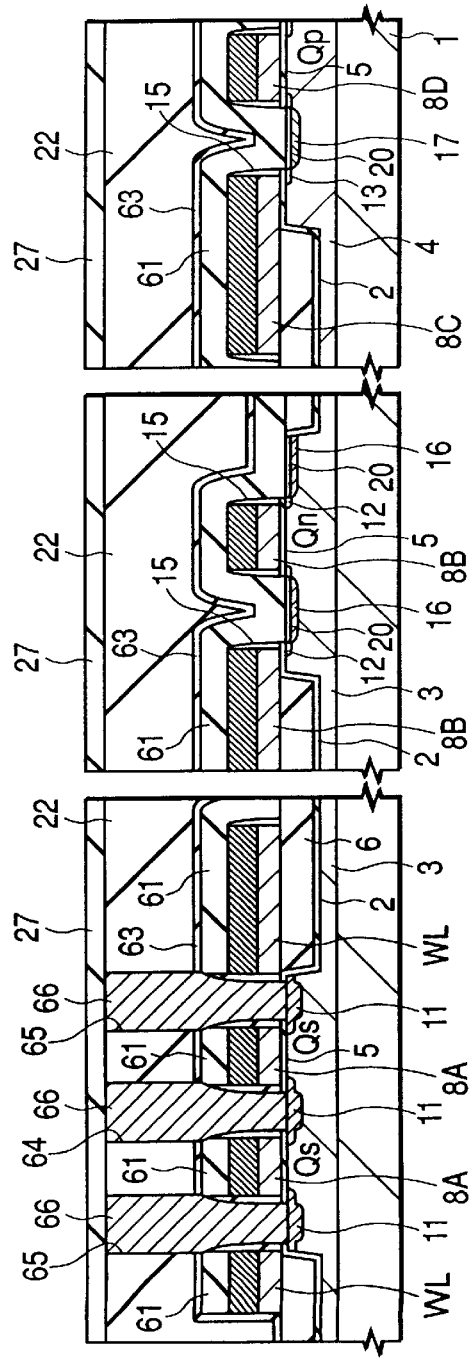

METHOD OF MANUFACTURING A SEMICONDUCTOR INTEGRATED CIRCUIT DEVICE

FIELD OF THE INVENTION

The present invention relates to technology for manufacturing semiconductor integrated circuit devices. More particularly, it relates to techniques which are effective when applied to the manufacture of a semiconductor integrated circuit device wherein both a DRAM (Dynamic Random Access Memory) and a logic LSI (large-scale integrated circuit) are mounted.

BACKGROUND OF THE INVENTION

In recent years, a DRAM being a typical memory LSI has been manufactured by adopting a so-called 'stacked capacitor structure' wherein a capacitor (or capacitance element) for storing information is arranged over a MISFET (Metal Insulator Semiconductor Field Effect Transistor) for selecting a memory cell, in order to compensate for that decrease in the quantity of storage charges (electric charges to-be-stored) of the information storing capacitor which is attendant upon the microfabrication of the memory cell.

On the other hand, in a logic LSI of high performance, the adoption of a so-called 'silicidation technique' wherein a refractory metal silicide layer of, for example, $CoSi_2$ (cobalt silicide) or $TiSi_2$ (titanium silicide) is formed on the surfaces of the source and drain of a MISFET has been promoted as a measure to suppress those increases in the resistances of the source and drain which are attendant upon the microfabrication of contact holes for respectively connecting the source and drain with wiring lines.

SUMMARY OF THE INVENTION

The inventors have been developing a so-called 'system LSI' wherein a DRAM and a logic LSI are formed on an identical semiconductor substrate as stated before.

In the DRAM which forms a part of the system LSI, bit lines are comprised of a metal material of low resistance principally containing a refractory metal such as W (tungsten), as a measure to counter the signal delays of the bit lines, while the bit lines and the first-layer wiring lines of a peripheral circuit are formed by the same step as that of the first-layer wiring lines of the logic LSI, as a measure to diminish the number of the steps of forming wiring lines.

Besides, as a measure to keep the quantity of storage charges of each information storing capacitor, the DRAM is so constructed that the information storing capacitors are arranged over the bit lines, thereby to further the multilevel configuration of the capacitors, while the capacitance insulator film of each capacitor is comprised of a ferroelectric material such as $Ta_2O_5$ (tantalum oxide).

Moreover, the DRAM is manufactured by adopting a so-called 'Gate-Self Align Contact' technique (hereinbelow, termed 'gate-SAC technique') wherein, in a case where a contact hole for connecting the bit line and the substrate (the source or drain of a memory-cell selecting MISFET) is to be formed in the interspace between the gate electrodes of the memory-cell selecting MISFETs of narrowed pitch, the top parts and side walls of the gate electrodes are covered with a silicon nitride film, a silicon oxide film is thereafter deposited on the silicon nitride film, and the contact hole is subsequently formed in self-alignment with the gate electrodes by utilizing the difference between the etching rates of the silicon oxide film and silicon nitride film.

On the other hand, in the logic LSI which forms another part of the system LSI, the silicidation technique wherein a refractory metal silicide layer of low resistance is formed on the surfaces of the source and drain of each MISFET is adopted in order to further a fast operation.

Besides, the logic LSI is manufactured by adopting a so-called 'Locos-Self Align Contact' technique (hereinbelow, termed 'L-SAC technique') wherein contact holes for respectively connecting the source and drain with wiring lines of first layer are formed in self-alignment with element isolation regions in order to cope with the microfabrication of the elements and the reduction of the areas of the source and drain for lowering junction capacitances.

According to the L-SAC technique, the MISFET is covered with a silicon nitride film after the formation thereof, and a silicon oxide film is deposited on the silicon nitride film. In forming the contact holes on the source and drain, the silicon oxide film is first etched by employing the silicon nitride film as a mask, and the underlying silicon nitride film is thereafter etched to denude the source and drain. On this occasion, the silicon nitride film is formed as a comparatively thin film, whereby the quantity of corrosion or excavation of the silicon oxide film of the element isolation regions can be decreased in case of over-etching.

Problems to be explained below, however, must be solved in the above-stated manufacturing process for the system LSI wherein the DRAM and the logic LSI are formed on the identical semiconductor substrate.

The top parts and side walls of the gate electrodes need to be covered with the silicon nitride film in order that the contact hole may be formed in the interspace between the gate electrodes of the memory-cell selecting MISFETs each constituting the memory cell of the DRAM, in self-alignment fashion by adopting the gate-SAC technique. A gate machining process in this case is such that a conductor film for the gate electrodes is formed on the semiconductor substrate, that a silicon nitride film is subsequently formed on the conductor film, and that the silicon nitride film and the underlying conductor film for the gate electrodes are thereafter patterned by etching with a photoresist film used as a mask, whereby the gate electrodes of the memory-cell selecting MISFETs and the gate electrode of the MISFET of the logic LSI are formed at the same time.

The above process, however, involves the problem that a hole cannot be provided over the gate electrode of the MISFET of the logic LSI in the case where the contact holes are to be formed on the source or drain of the memory-cell selecting MISFET and on the gate electrode and the source and drain of the MISFET of the logic LSI by etching the silicon oxide film formed over the MISFET. More specifically, the gate electrode of the MISFET of the logic LSI is overlaid with the silicon nitride film for the L-SAC, in addition to the silicon nitride film for the gate-SAC. Therefore, when the contact hole is to be formed on the gate electrode by etching the silicon nitride films of two layers, the etching over the source and drain proceeds in excess, and the silicon oxide film Fuji of the element isolation regions is deeply corroded or excavated to incur such a serious problem as the increases of junction leakage currents. On the other hand, when the quantity of etching over each of the source and drain is lessened in order to relieve the corrosion of the element isolation regions, the quantity of etching on the gate electrode becomes insufficient, to pose the drawback that the bottom of the contact hole formed does not reach the gate electrode.

It is also considered for avoiding the above problems that the contact hole over the gate electrode, and the contact holes over the source and drain are formed by separate steps. However, this countermeasure poses, not only the problem that the number of processing steps increases, but also the problem that the allowance of registration for the contact hole over the gate electrode and the contact holes over the source and drain cannot be ensured in the microfabricated MISFET.

An object of the present invention is to provide, in the manufacture of a semiconductor integrated circuit device wherein both a DRAM and a logic LSI are mounted, a technique which can make compatible the gate-SAC technique of the DRAM and the L-SAC technique of the logic LSI.

The above and other objects and novel features of the present invention will become apparent from the description of this specification when read in conjunction with the accompanying drawings.

Typical aspects of performance of the present invention are briefly summarized as follows:

A method of manufacturing a semiconductor integrated circuit device according to the present invention comprises the steps of (a) forming a plurality of first gate electrodes comprised of a first conductor layer, and a first insulator layer covering the first gate electrodes, in a first area of a principal surface of a semiconductor substrate, also forming a plurality of second gate electrodes comprised of the first conductor layer in a second area of the principal surface of the semiconductor substrate, and further forming a plurality of semiconductor regions in a third area of said principal surface of said semiconductor substrate; (b) forming a second insulator layer on said principal surface of said semiconductor substrate, and also forming a third insulator layer on the second insulator layer; (c) forming a first hole in those parts of the third insulator layer and said second insulator layer which cover a first spacial area lying between the respectively adjacent first gate electrodes formed in the first area of said principal surface, thereby to denude that surface part of said semiconductor substrate which corresponds to the first spacial area; and (d) forming a second hole in those parts of said third insulator layer and said second insulator layer which cover each of the plurality of second gate electrodes formed in the second area of said principal surface, thereby to denude a surface of said each second gate electrode, and also forming a third hole in those parts of said third insulator layer and said second insulator layer which cover each of the plurality of semiconductor regions formed in the third area of said principal surface, thereby to denude a surface of said each semiconductor region; wherein the first insulator layer is not formed on said plurality of second gate electrodes at the step (a), and the first hole is formed in self-alignment with said respectively adjacent first gate electrodes at the step (c).

In addition, according to the present invention, a method of manufacturing a semiconductor integrated circuit device including a first memory cell area in which memory cells each having a first MISFET and a capacitor connected in series are arranged in a matrix shape, and a second circuit area in which a plurality of second MISFETs are formed, comprises the steps of:

(a) forming a first conductor layer on a principal surface of a semiconductor substrate, and selectively patterning that part of the first conductor layer which lies in the second circuit area, thereby to form gate electrodes of the second MISFETs in said second circuit area and to leave said first conductor layer behind in the first memory cell area;

(b) forming a first insulator layer on the principal surface of the semiconductor substrate, and selectively patterning those parts of the first insulator layer and said first conductor layer which lie in said first memory cell area, thereby to form gate electrodes of the first MISFETs as are covered with said first insulator layer, in said first memory cell area, and to leave said first insulator layer behind in said second circuit area;

(c) forming a second insulator layer on said principal surface of said semiconductor substrate, and also forming a third insulator layer on the second insulator layer;

(d) forming a first hole in those parts of the third insulator layer and said second insulator layer which cover a spacial area lying between the respectively adjacent gate electrodes of said first MISFETs, in self-alignment with said respectively adjacent gate electrodes of said first MISFETs, thereby to denude a surface of a source or drain of each of said first MISFETs; and (e) forming a second hole in those parts of said third insulator layer and said second insulator layer which cover the gate electrode of each of said second MISFETs, thereby to denude a surface of said gate electrode of said each second MISFET, and also forming a third hole in those parts of said third insulator layer and said second insulator layer which cover a source or drain of said each second MISFET, thereby to denude a surface of the source or drain of said each second MISFET.

Besides, according to the present invention, a method of manufacturing a semiconductor integrated circuit device including a first memory cell area in which memory cells each having a first MISFET and a capacitor connected in series are arranged in a matrix shape, and a second circuit area in which a plurality of second MISFETs are formed, comprises the steps of:

(a) forming a first conductor layer on a principal surface of a semiconductor substrate, and subsequently patterning the first conductor layer, thereby to form gate electrodes of the second MISFETs in the second circuit area and to leave said first conductor layer behind in the first memory cell area;

(b) forming side wall spacers on side walls of each of the gate electrodes of said second MISFETs;

(c) forming semiconductor regions to make up a source and drain of each of said second MISFETs, in those parts of the semiconductor substrate which lie on both sides of the gate electrode of said each second MISFET;

(d) forming a refractory metal layer on the principal surface of said semiconductor substrate, and subsequently heat-treating said semiconductor substrate, thereby to form a silicide layer on surfaces of said gate electrode and the source and drain of said each second MISFET and on a surface of said first conductor layer left behind in said first memory cell area;

(e) forming a first insulator layer on said principal surface of said semiconductor substrate, and r selectively patterning those parts of the first insulator layer and said first conductor layer which lies in said first memory cell area, thereby to form gate electrodes of the first MISFETs as are covered with said first insulator layer, in said first memory cell area, and to leave said first insulator layer behind in said second circuit area;

(f) forming a second insulator layer on said principal surface of said semiconductor substrate, and also forming a third insulator layer on the second insulator layer;

(g) forming a first hole in those parts of the third insulator layer and said second insulator layer which cover a spacial area lying between the respectively adjacent gate electrodes of said first MISFETs, in self-alignment with said respectively adjacent gate electrodes of said first MISFETs, thereby to denude a surface of a source or drain of each of said first MISFETs; and (h) forming a second hole in those parts of said third insulator layer and said second insulator layer which cover said gate electrode of said each second MISFETs, thereby to denude the surface of said gate electrode of said each second MISFET, and also forming a third hole in those parts of said third insulator layer and said second insulator layer which cover a source or drain of said each second MISFET, thereby to denude a surface of the source or drain of said each second MISFET.

BRIEF DESCRIPTION OF THE DRAWINGS

FIG. 7 is a sectional view of the essential portions of the semiconductor substrate showing the method of manufacturing the system LSI in Embodiment 1 of the present invention;

FIG. 8 is a sectional view of the essential portions of the semiconductor substrate showing the method of manufacturing the system LSI in Embodiment 1 of the present invention;

FIG. 18 is a sectional view of the essential portions of the semiconductor substrate showing the method of manufacturing the system LSI in Embodiment 1 of the present invention;

FIG. 19 is a sectional view of the essential portions of the semiconductor substrate showing the method of manufacturing the system LSI in Embodiment 1 of the present invention;

FIG. 29 is a sectional view of the essential portions of a semiconductor substrate showing a method of manufacturing a system LSI in Embodiment 2 of the present invention;

FIG. 30 is a sectional view of the essential portions of the semiconductor substrate showing the method of manufacturing the system LSI in Embodiment 2 of the present invention;

FIG. 31 is a sectional view of the essential portions of the semiconductor substrate showing the method of manufacturing the system LSI in Embodiment 2 of the present invention;

FIG. 32 is a sectional view of the essential portions of the semiconductor substrate showing the method of manufacturing the system LSI in Embodiment 2 of the present invention;

FIG. 37 is a sectional view of the essential portions of the semiconductor substrate showing the method of manufacturing the system LSI in Embodiment 2 of the present invention;

FIG. 38 is a sectional view of the essential portions of the semiconductor substrate showing the method of manufacturing the system LSI in Embodiment 2 of the present invention;

DESCRIPTION OF THE PREFERRED EMBODIMENTS

Now, the embodiments of the present invention will be described in detail with reference to the drawings. Throughout the drawings illustrative of the embodiments, the same symbols are assigned to parts or members having the same functions, which shall be omitted from repeated description.

(Embodiment 1)

This embodiment is applied to a method of manufacturing a system LSI wherein a DRAM is arranged in the first area of the principal surface of a semiconductor substrate, a logic LSI is arranged in the second area thereof, and an SRAM is arranged in the third area thereof.

Figure 1:
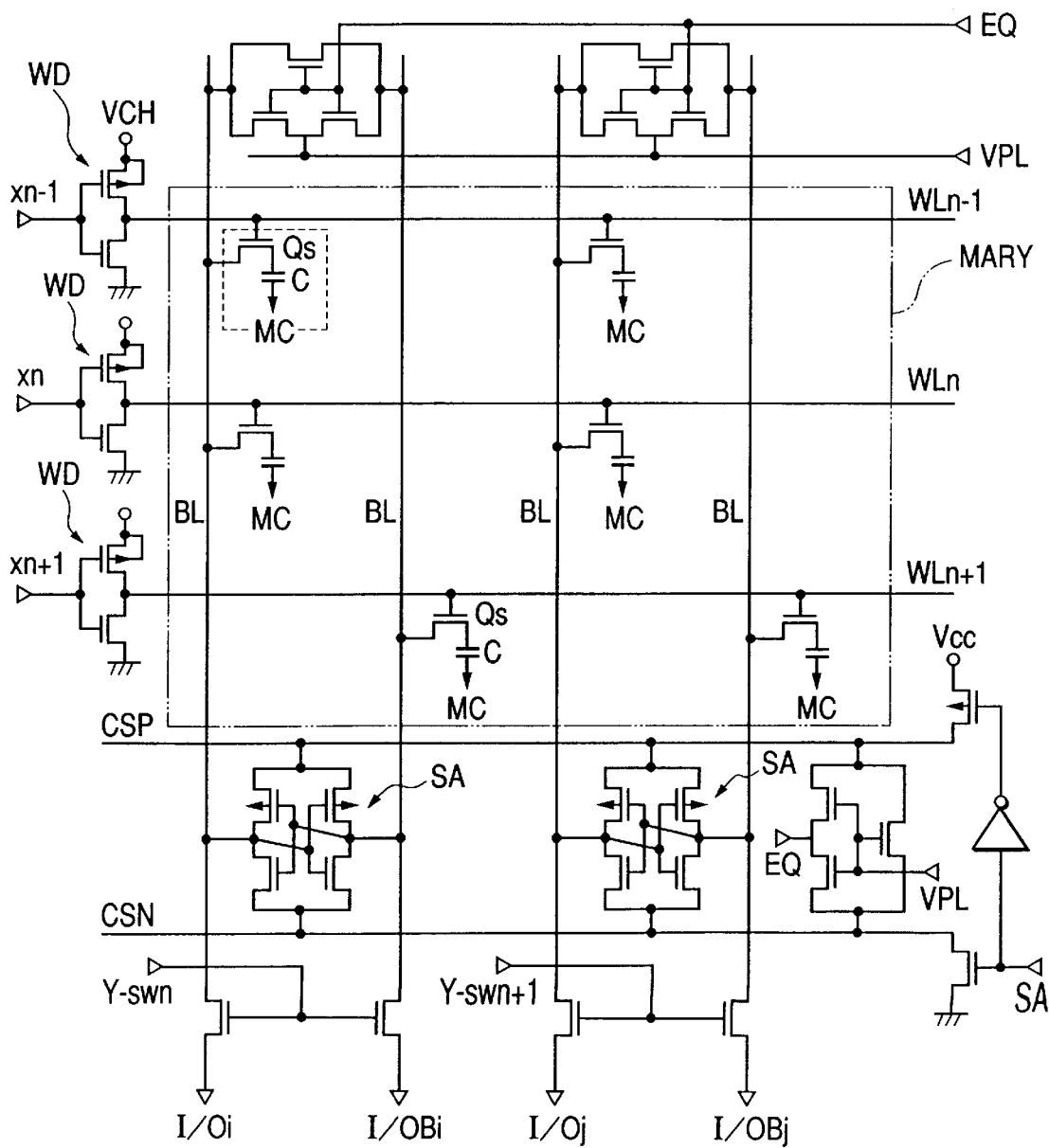
FIG. 1 is an equivalent circuit diagram of a which forms a part of a system LSI in Embodiment 1 of the present invention.

As shown in FIG. 1, each of the memory cells (MC) of a DRAM which forms a part of a system LSI includes a memory-cell selecting MISFET Qs which is arranged at the intersection part between a word line WL (the corresponding one of word lines WLn−1, WLn, WLn+1 . . .) and a bit line BL (the corresponding one of bit lines BL), and a information storing capacitor (or capacitance element) C which is connected in series with the MISFET Qs. Either of the source and drain of the memory-cell selecting MISFET Qs being an n-channel MISFET is electrically connected with the information storing capacitor C, while the other is electrically connected with the bit line BL. One end of the word line WL is connected to a word driver WD which is a peripheral circuit. One end of the bit line BL is connected to a sense amplifier SA which is also a peripheral circuit.

Figure 2:
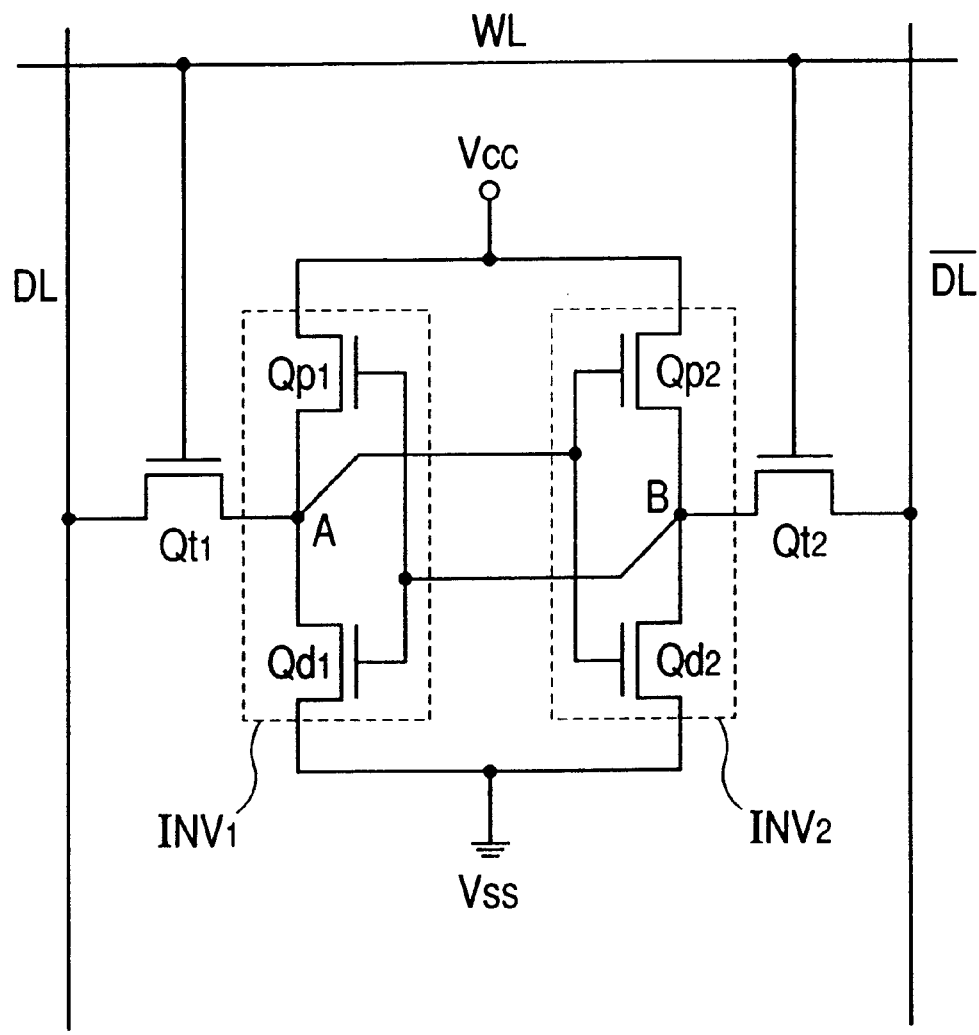
FIG. 2 is an equivalent circuit diagram of an SRAM which forms a part of the system LSI in Embodiment 1 of the present invention.

As shown in FIG. 2, each memory cell (MC) of an SRAM which forms another part of the system LSI includes a pair of drive MISFETs $Qd_1$, $Qd_2$, a pair of load MISFETs $Qp_1$, $QP_2$, and a pair of transfer MISFETs $Qt_1$ $Qt_2$ which are arranged at the intersection parts between a pair of complementary data lines (a data line DL, a data line /(bar)DL) and the word line WL. Each of the drive MISFETs $Qd_1$, $Qd_2$ and transfer MISFETs $Qt_1$, $Qt_2$ is an n-channel MISFET, whereas each of the load MISFETs $Qp_1$, $QP_2$ is a p-channel MISFET.

Among the six MISFETs constituting the memory cell (MC) of the SRAM, the drive MISFET $Qd_1$ and the load MISFET $Qp_1$ construct a CMOS inverter $INV_1$, and the drive MISFET $Qd_2$ and the load MISFET $Qp_2$ construct a CMOS inverter $INV_2$. The cross-connected input/output terminals (storage nodes A, B) of the pair of CMOS inverters $INV_1$, $INV_2$ constitute a flip-flop circuit which functions as an information storage portion for storing information of 1 (one) bit. One input/output terminal (storage node A) of the flip-flop circuit is electrically connected with the source region of the transfer MISFET $Qt_1$, while the other input/output terminal (storage node B) is electrically connected with the source region of the transfer MISFET $Qt_2$.

The drain region of the transfer MISFET $Qt_1$ is connected to the data line DL, and that of the r transfer MISFET $Qt_2$ to the data line /DL. In addition, one end (the respective source regions of the load MISFETs $Qp_1$, $QP_2$) of the flip-flop circuit is connected to a supply voltage ($V_{cc}$), and the other end (the respective source regions of the drive MISFETs $Qd_1$, $Qd_2$) to a reference voltage Via.

Although not shown in the drawings, a logic LSI which forms still another part of the system LSI includes n-channel MISFETs and p-channel MISFETs.

By the way, a technique for forming a DRAM and an SRAM over an identical substrate is disclosed in, for example, U. S. Pat. No. 5,780,910 (Ser. No. 682,243 filed on Jul. 16, 1996 by the same inventors as those of the present application). In particular, it is described in detail as the second embodiment of the patented invention illustrated in FIGS. 24–39.

Next, an example of a method of manufacturing the above system LSI will be described in the order of the steps thereof with reference to FIG. 3~FIG. 28 (sectional views of a semiconductor substrate). The left area of each of these figures illustrates part of a DRAM forming area (or illustrates only memory cells), the middle area illustrates part of a logic LSI forming area (or illustrates only an n-channel MISFET), and the right area illustrates part of an SRAM forming area (or illustrates only part of each of a drive MISFET and a load MISFET).

Figure 3:
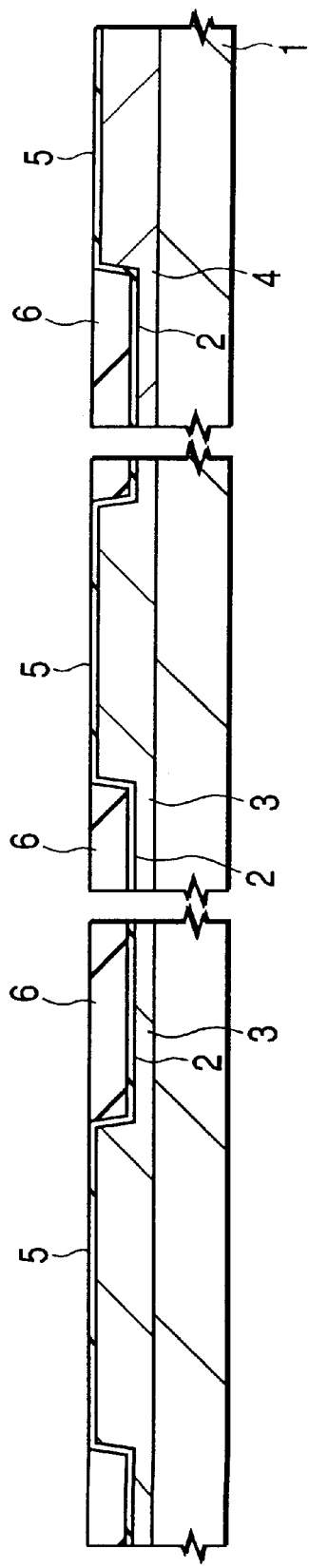
FIG. 3 is a sectional view of the essential portions of a semiconductor substrate showing a method of manufacturing the system LSI in Embodiment 1 of the present invention.

In order to manufacture the system LSI of this embodiment, as shown in FIG. 3, element isolation trenches 2 are first formed in the principal surface of a semiconductor substrate 1 which is comprised of, for example, single-crystal silicon of p-type. Thereafter, a p-type impurity (for example, boron) and an n-type impurity (for example, phosphorus) are respectively introduced into one part and the other part of the semiconductor substrate 1 by ion implantations so as to form a p-type well 3 and an n-type well 4. The resulting semiconductor substrate 1 is subsequently heat-treated, thereby to form a gate oxide film 5 on the surfaces of the active regions of the p-type well 3 and n-type well 4. The element isolation trenches 2 are formed in such a way that grooves or trenches are provided by etching the element isolation regions of the semiconductor substrate 1, that a silicon oxide film 6 is deposited on the resulting semiconductor substrate 1 by CVD (Chemical Vapor Deposition), and that the silicon oxide film 6 is flattened by CMP (Chemical Mechanical Polishing) so as to be left behind in the grooves only.

Figure 4:
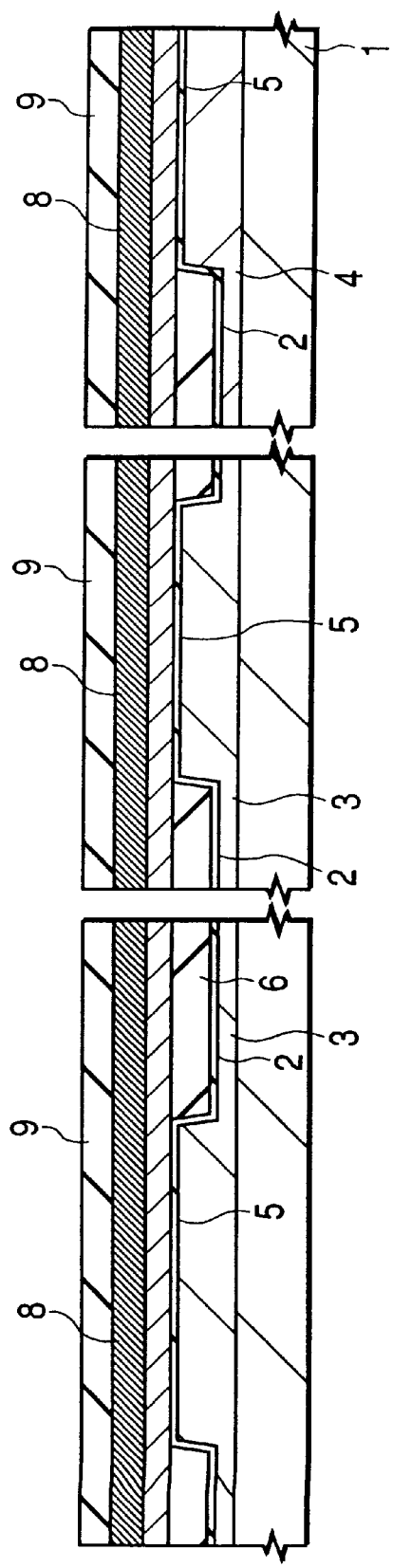
FIG. 4 is a sectional view of the essential portions of the semiconductor substrate showing the method of manufacturing the system LSI in Embodiment 1 of the present invention.

Next, as shown in FIG. 4, a conductor film 8 for gate electrodes is formed on the gate oxide film 5, and a silicon nitride film 9 being about 200 nm thick is deposited on the conductor film 8 by CVD. The conductor film 8 for the gate electrodes is comprised of, for example, a stacked film (poly-cide film) which includes a polycrystal silicon film deposited to a thickness of about 100 nm by CVD and a tungsten silicide film similarly deposited to a thickness of about 100 nm. The polycrystal silicon film is doped with an n-type impurity (for example, arsenic). Besides, in a case where an n-channel MISFET and a p-channel MISFET are fabricated into a dual gate structure, a polycrystal silicon film containing no impurity is deposited, followed by doping the polycrystal silicon film in an n-channel MISFET forming area with an n-type impurity (for example, arsenic) and doping the polycrystal silicon film in a p-channel MISFET forming area with a p-type impurity (for example, boron). Alternatively to the poly-cide film, the conductor film 8 for the gate electrodes may well be comprised of, for example, a stacked film (poly-metal film) which includes a polycrystal silicon film, a tungsten nitride film and a tungsten film.

Figure 5:
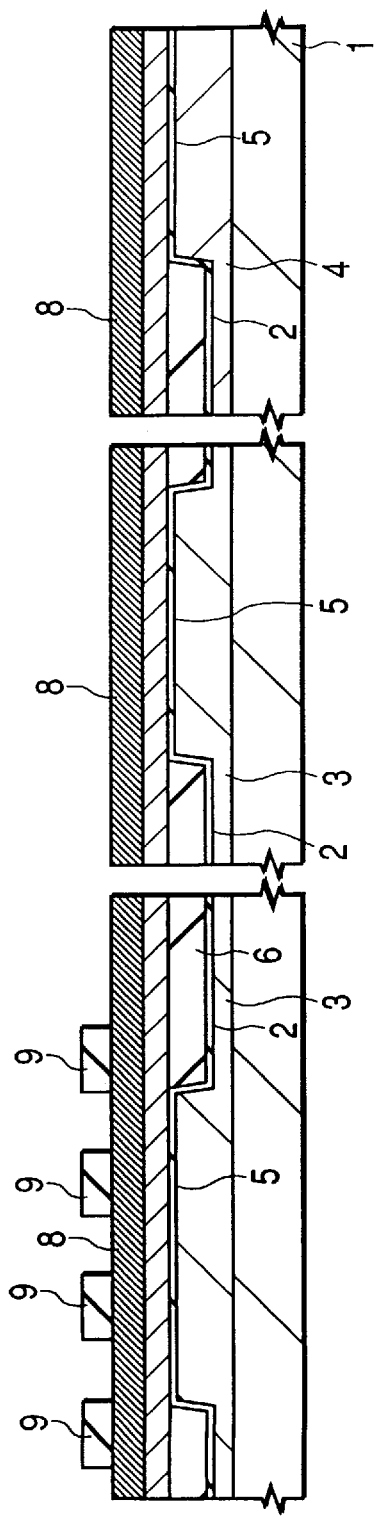
FIG. 5 is a sectional view of the essential portions of the semiconductor substrate showing the method of manufacturing the system LSI in Embodiment 1 of the present invention.

Subsequently, as shown in FIG. 5, the silicon nitride film 9 in the DRAM forming area is patterned by etching which employs a photoresist film as a mask. Thus, a silicon nitride film 9 in the same pattern as that of gate electrodes 8A (word lines WL) to be formed later is formed. Besides, at this step, the silicon nitride film 9 in regions in which contact holes are to be formed on the gate electrodes by a later step are selectively removed.

Figure 6:
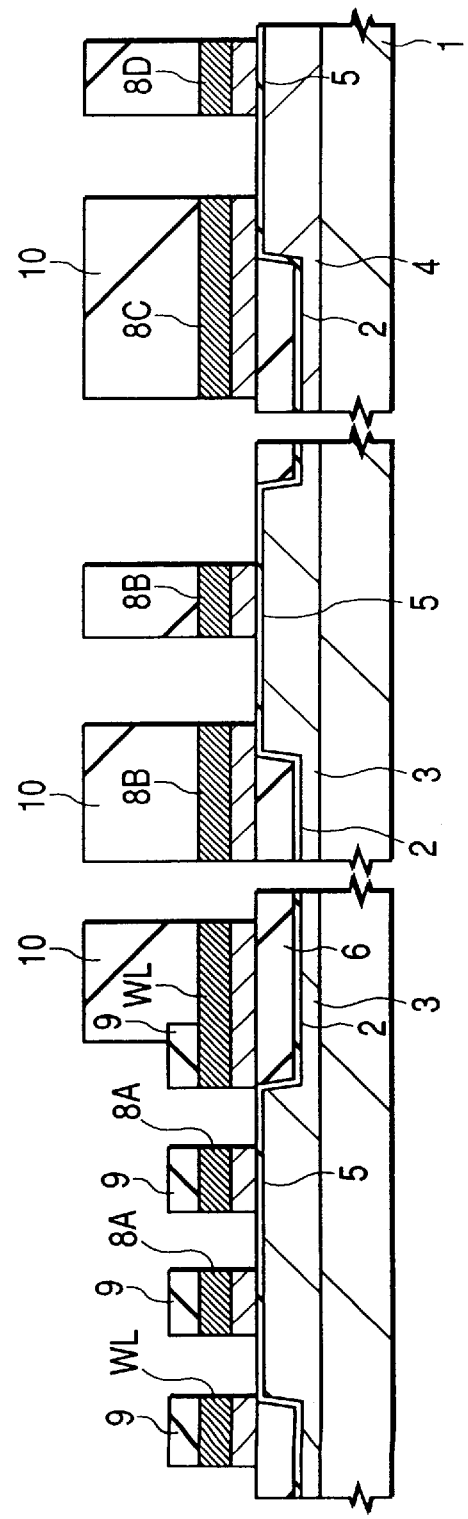
FIG. 6 is a sectional view of the essential portions of the semiconductor substrate showing the method of manufacturing the system LSI in Embodiment 1 of the present invention.

Subsequently, as shown in FIG. 6, the conductor film 8 for the gate electrodes is patterned by etching with the silicon nitride film 9 and a photoresist film 10 employed as a mask, thereby to form the gate electrodes 8A (word lines WL) of MISFETs Qs for selecting the memory cells of a DRAM, the gate electrodes 8B of the n-channel MISFETs Qn of a logic LSI, the gate electrode 8C of the drive MISFET Qd of an SRAM and the gate electrode 8D of the load MISFET Qp thereof. Incidentally, one end part of the word line WL of the DRAM (that is, a wiring lead-out area indicated by an arrow in FIG. 6) has the silicon nitride film 9 removed therefrom beforehand by the step shown in FIG. 5, and it is kept covered with the photoresist film 10 during the formation of the gates, whereby the silicon nitride film 9 is prevented from remaining on the end part (FIG. 6).

In this manner, according to the manufacturing method of Embodiment 1, the silicon nitride film 9 is left behind on only the gate electrodes 8A (word lines WL) of the memory-cell selecting MISFETs of the DRAM (except on the wiring lead-out area of the word line WL), and it is not left behind on any of the gate electrodes 8B of the MISFETs constituting the logic LSI and the gate electrodes 8C, 8D of the MISFETs constituting the memory cell of the SRAM.

At the next step, as shown in FIG. 7, the ions of an n-type impurity (for example, phosphorus) are implanted into the p-type well 3, thereby to form n-type semiconductor regions 11 which construct the sources and drains of the memory-cell selecting MISFETs Qs. At this time, n$^-$-type semiconductor regions 12 are simultaneously formed in those parts of the p-type well 3 which lie on both the sides of the gate electrode 8B of the n-channel MISFET Qn. Subsequently, the ions of a p-type impurity (for example, boron) are implanted into the n-type well 4, thereby to form p$^-$-type semiconductor regions 13 in those parts of the n-type well 4 which lie on both the sides of the gate electrode 8D of the load MISFET Qp. The memory-cell selecting MISFETs Qs of the DRAM are substantially finished by the steps thus far explained.

At the next step, as shown in FIG. 8, a silicon nitride film deposited on the semiconductor substrate 1 by CVD is processed by anisotropic etching, thereby to form side wall spacers 15 of silicon nitride on both the side walls of each of the gate electrodes 8A~8D. Subsequently, the ions of an n-type impurity (for example, phosphorus) are implanted into the p-type well 3 in the logic LSI forming area, thereby to form n$^+$-type semiconductor regions 16 in those parts of the p-type well 3 which lie on both the sides of the gate electrode 8B of the n-channel MISFET Qn. Besides, the ions of a p-type impurity (for example, boron) are implanted into the n-type well 4 in the SRAM forming area, thereby to form p$^+$-type semiconductor regions 17 in those parts of the n-type well 4 which lie on both the sides of the gate electrode 8D of the load MISFET Qp. Owing to the steps thus far explained, there are substantially finished that n-channel MISFET Qn of the logic LSI which has the source and drain of LDD (Lightly Doped Drain) structure including the n$^-$-type semiconductor regions 12 and n$^+$-type semiconductor regions 16, and that load MISFET Qp of the SRAM which has the source and drain of LDD structure including p$^-$-type semiconductor regions 13 and p$^+$-type semiconductor regions 17.

Figure 9:
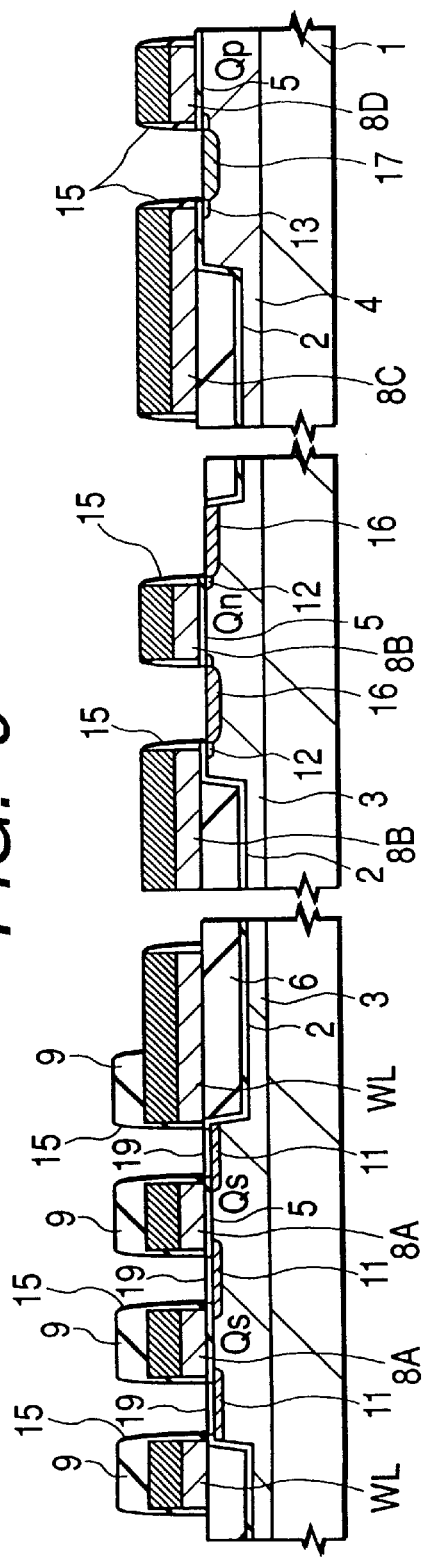
FIG. 9 is a sectional view of the essential portions of the semiconductor substrate showing the method of manufacturing the system LSI in Embodiment 1 of the present invention.

At the next step, as seen from FIG. 9, the surface of the semiconductor substrate 1 is thinly or slightly etched with an etchant based on fluoric acid, so as to denude the sources and drains (n-type semiconductor regions 11) of the memory-cell selecting MISFETs Qs, the source and drain (n$^+$-type semiconductor regions 16) of the n-channel MISFET Qn, and the source and drain (p$^+$-type semiconductor regions 17) of the load MISFET Qp. Further, a thin silicon oxide film 19 deposited on the semiconductor substrate 1 to a thickness of about 5~10 nm by CVD is etched so as to be left behind on the sources and drains (n-type semiconductor regions 11) of the memory-cell selecting MISFETs Qs, and to be removed from the surfaces of the source and drain (n$^+$-type semiconductor regions 16) of the n-channel MISFET Qn and the source and drain (p$^+$-type semiconductor regions 17) of the load MISFET Qp. Incidentally, the thin silicon oxide film 19 may well be formed by thermally oxidating the semiconductor substrate 1.

Figure 10:
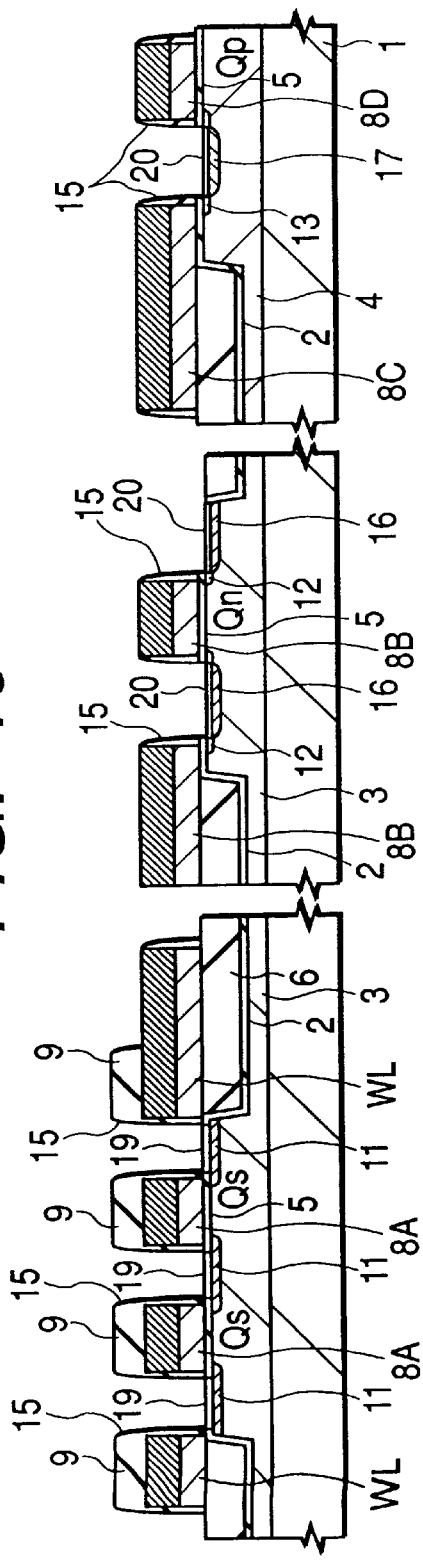
FIG. 10 is a sectional view of the essential portions of the semiconductor substrate showing the method of manufacturing the system LSI in Embodiment 1 of the present invention.

Subsequently, as seen from FIG. 10, a Co (cobalt) film 20a is deposited on the semiconductor substrate 1 by sputtering, and the resulting semiconductor substrate 1 is heat-treated. Thus, Co silicide layers 20 are formed on the surfaces of the source and drain (n$^+$-type semiconductor regions 16) of the n-channel MISFET Qn and the source and drain (p$^+$-type semiconductor regions 17) of the load MISFET Qp. Since, at this time, the surfaces of the sources and drains (n-type semiconductor regions 11) of the memory-cell selecting MISFETs Qs are covered with the silicon oxide film 19, they are not formed with the Co silicide layers 20.

In this manner, according to the manufacturing method of Embodiment 1, the Co silicide layers 20 are formed on the surfaces of the source and drain (n$^+$-type semiconductor regions 16) of the MISFET constituting the logic LSI (the n-channel MISFET Qn) and the source and drain (p$^+$-type semiconductor regions 17) of the load MISFET Qp constituting the memory cell of the SRAM, whereby the resistances of these sources and drains are lowered to realize the high speed operations of the logic LSI and SRAM. On the other hand, the Co silicide layers 20 are not formed on the surfaces of the sources and drains of the memory-cell selecting MISFETs Qs constituting the memory cells of the DRAM, whereby the leakage currents of the memory cells are diminished to prevent refresh characteristics from degrading. Incidentally, the silicide layers may well be formed using a refractory metal (for example, Ti) other than Co.

Figure 11:
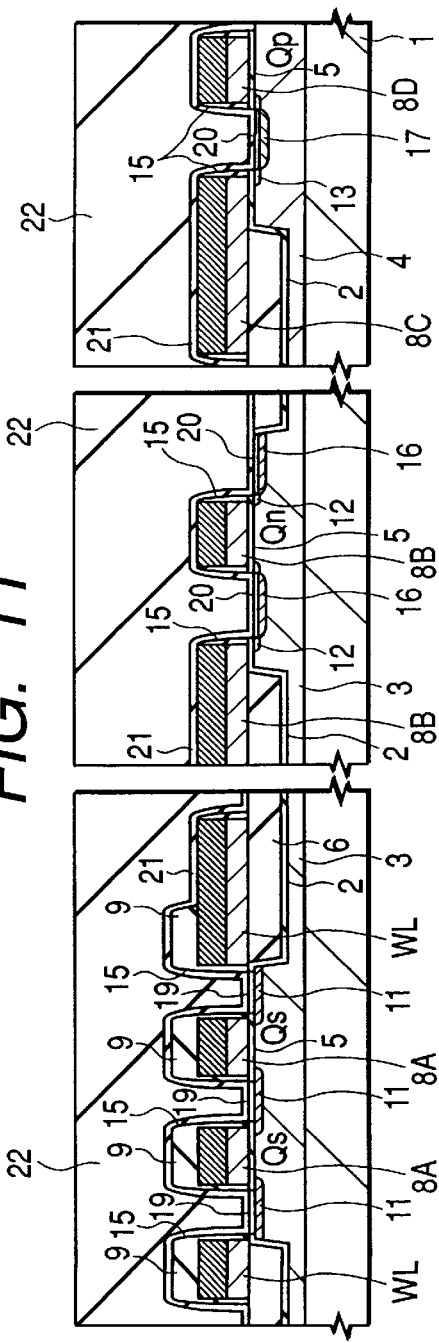
FIG. 11 is a sectional view of the essential portions of the semiconductor substrate showing the method of manufacturing the system LSI in Embodiment 1 of the present invention.

Next, as shown in FIG. 11, a silicon nitride film 21 having a thickness of about 100 nm is deposited on the semiconductor substrate 1 by CVD, a silicon oxide film 22 having a thickness of about 600 nm is subsequently deposited on the silicon nitride film 21 by CVD, and the surface of the silicon oxide film 22 is thereafter flattened by CMP.

Figure 12:
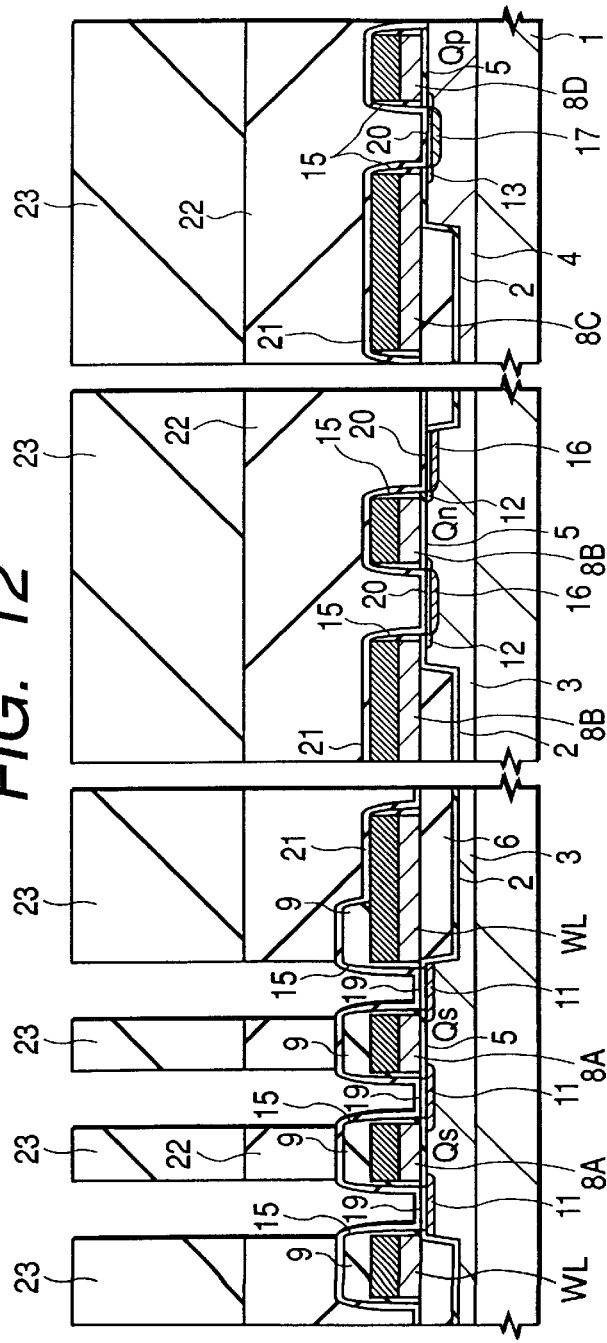
FIG. 12 is a sectional view of the essential portions of the semiconductor substrate showing the method of manufacturing the system LSI in Embodiment 1 of the present invention.

At the next step, as shown in FIG. 12, those parts of the silicon oxide film 22 which overlie the sources and drains (n-type semiconductor regions 11) of the memory-cell selecting MISFETs Qs are removed by etching which employs a photoresist film 23 as a mask. In order to prevent the removal of the silicon nitride film 21 underlying the silicon oxide film 22, the etching at this step is carried out using a gas which etches the silicon oxide film 22 at a high ratio of selection relative to the silicon nitride film 21.

Figure 13:
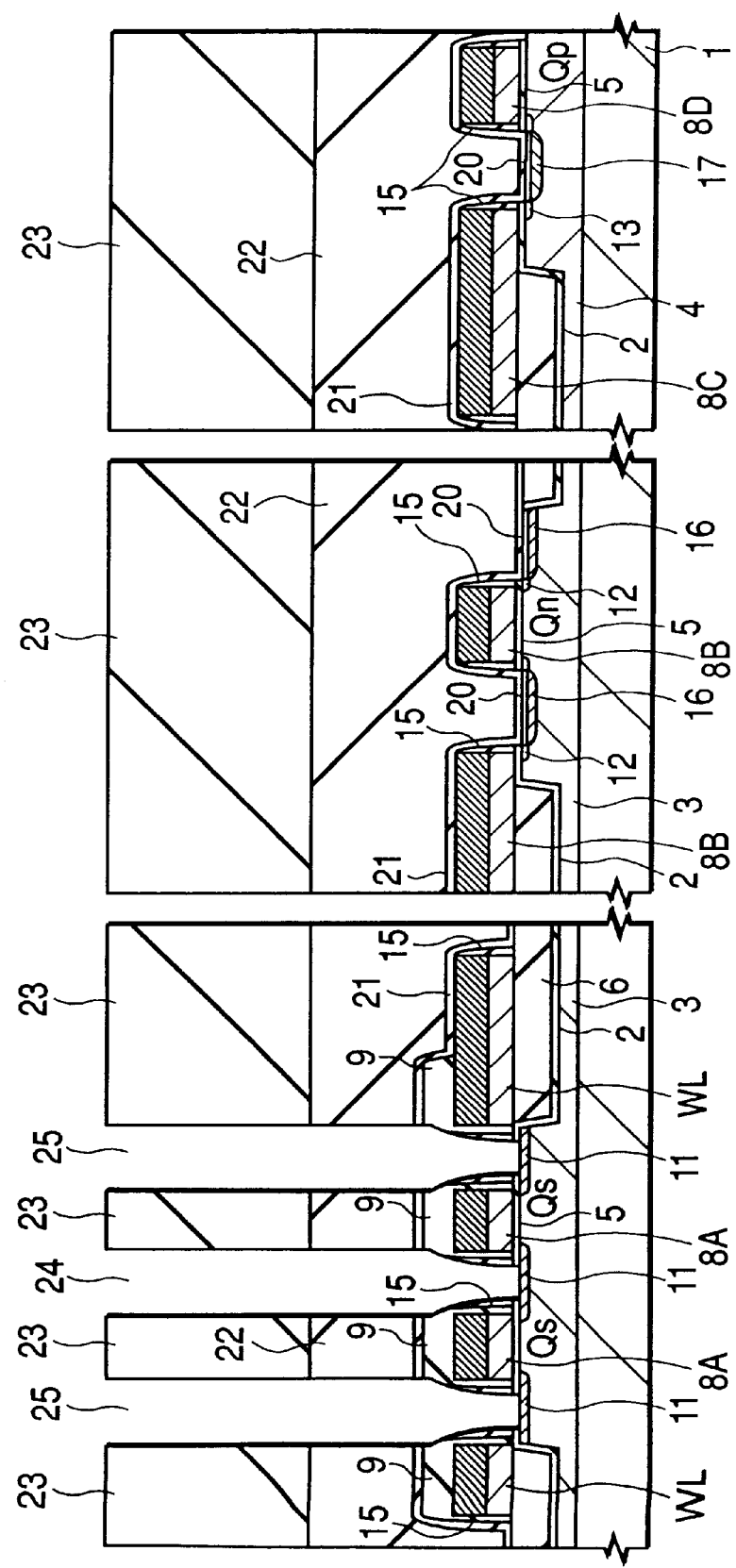
FIG. 13 is a sectional view of the essential portions of the semiconductor substrate showing the method of manufacturing the system LSI in Embodiment 1 of the present invention.

Next, as shown in FIG. 13, the silicon nitride film 21 overlying the sources and drains (n-type semiconductor regions 11) of the memory-cell selecting MISFETs Qs are removed by etching which employs the photoresist film 23 as a mask, followed by the removal of the thin silicon oxide film 19 having underlain the silicon nitride film 21. Thus, a contact hole 24 is formed on either of the sources and drains (n-type semiconductor regions 11), and contact holes 25 are formed on the other.

In order to minimize the quantity of corrosion or excavation of the semiconductor substrate 1, the above etching of the silicon nitride film 21 is carried out using a gas which etches the silicon nitride film 21 at a high ratio of selection relative to a silicon oxide film and silicon. In addition, the etching is carried out under conditions adapted to anisotropically etch the silicon nitride film 21, so as to leave the silicon nitride film 21 behind on the side walls of the gate electrodes 8A (word lines WL). Thus, the contact holes 24, 25 whose diameters are smaller than the spaces of the gate electrodes 8A (word lines WL) are formed in self-alignment with these gate electrodes 8A (word lines WL).

Figure 14:
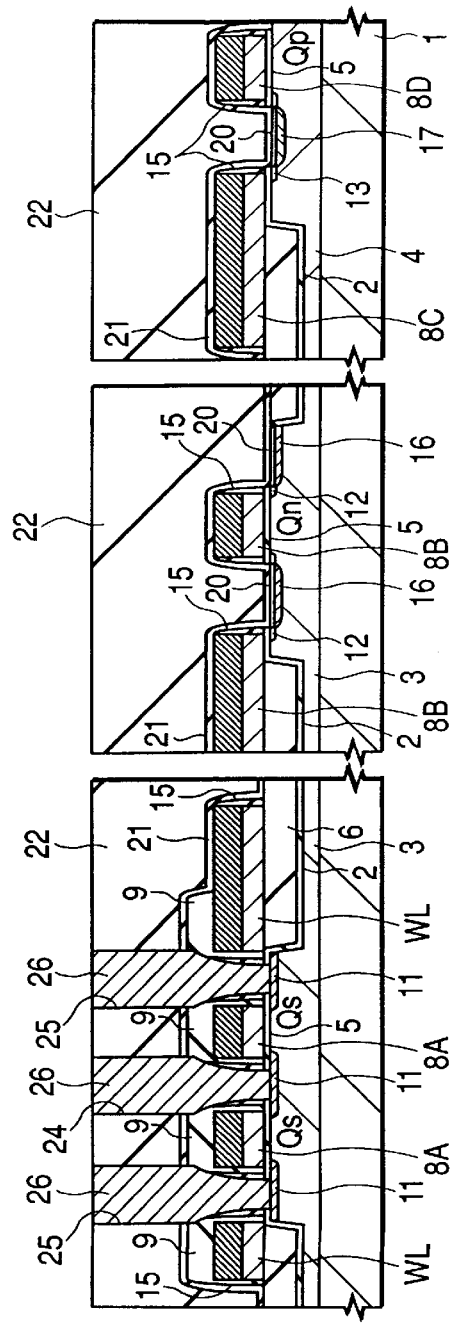
FIG. 14 is a sectional view of the essential portions of the semiconductor substrate showing the method of manufacturing the system LSI in Embodiment 1 of the present invention.

Next, as shown in FIG. 14, plugs 26 are formed in the contact holes 24, 25. The plugs 26 are formed in such a way that a polycrystal silicon film doped with an n-type impurity (for example, arsenic) and having a thickness of about 300 nm is deposited on the silicon nitride film 22 by CVD, and that the deposited polycrystal silicon film is flattened by CMP so as to be left behind within the contact holes 24, 25 only.

Figure 15:
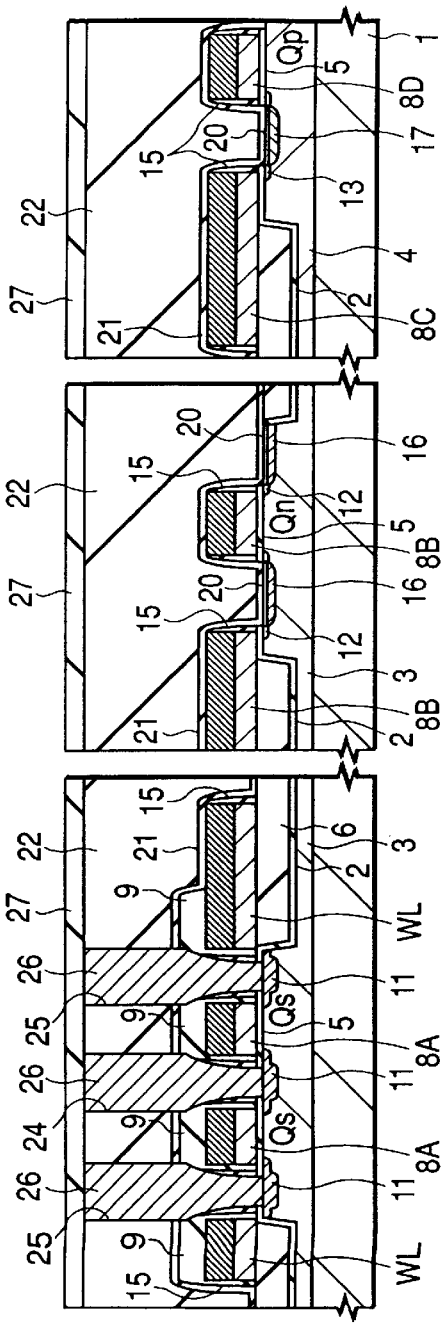
FIG. 15 is a sectional view of the essential portions of the semiconductor substrate showing the method of manufacturing the system LSI in Embodiment 1 of the present invention.

Subsequently, as shown in FIG. 15, a silicon oxide film 27 having a thickness of about 200 nm is deposited on the silicon nitride film 22 by CVD, and the resulting semiconductor substrate 1 is heat-treated in an atmosphere of inert gas. Owing to the heat treatment, the n-type impurity contained in the polycrystal silicon film forming the plugs 26 is diffused from the bottom parts of the contact holes 24, 25 into the n-type semiconductor regions 11 (sources and drains) of the memory-cell selecting MISFETs Qs. In consequence, the resistances of the n-type semiconductor regions 11 are lowered.

Figure 16:
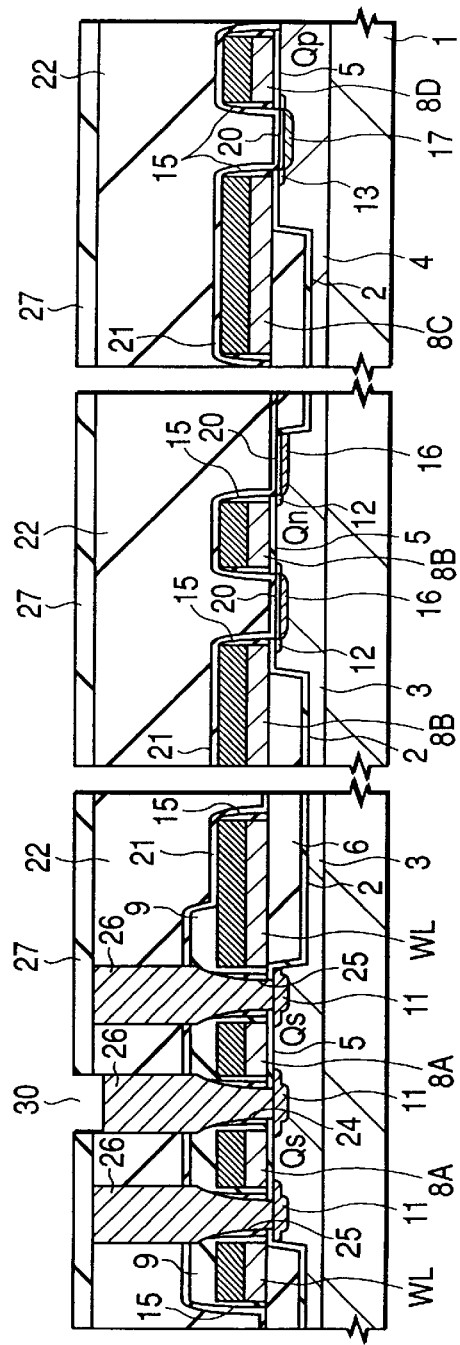
FIG. 16 is a sectional view of the essential portions of the semiconductor substrate showing the method of manufacturing the system LSI in Embodiment 1 of the present invention.
Figure 17:
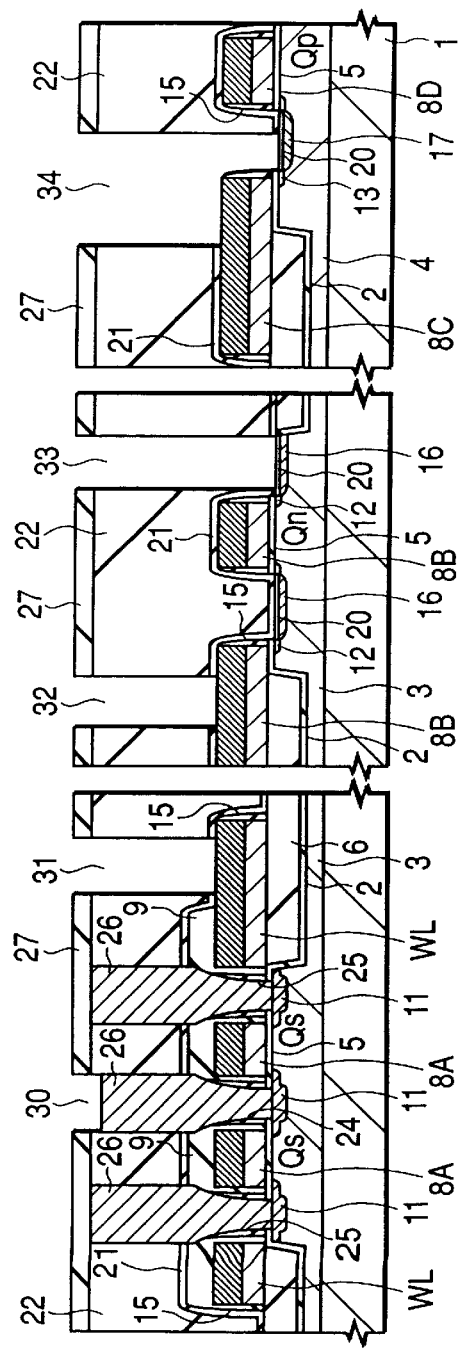
FIG. 17 is a sectional view of the essential portions of the semiconductor substrate showing the method of manufacturing the system LSI in Embodiment 1 of the present invention.

Next, as shown in FIG. 16, a through hole 30 is formed on the contact hole 24 by etching the silicon oxide film 27 with a photoresist film used as a mask. Subsequently, as shown in FIG. 17, the silicon oxide film 27 and the silicon oxide film 22 are etched with a photoresist film used as a mask, followed by the etching of the silicon nitride film 21. Thus, a contact hole 31 is formed over the wiring lead-out area of the word line WL, contact holes 32, 33 are respectively formed over the gate electrode 8B and the n$^+$-type semiconductor region 16 of the n-channel MISFET Qn, and a contact hole 34 is formed over an area which extends over the gate electrode BC of the drive MISFET Qd and the p$^+$-type semiconductor region 17 of the load MISFET Qp.

In order to prevent the removal of the underlying silicon nitride film 21, the above etching of the silicon oxide film 27 and silicon oxide film 22 is carried out using a gas which etches the silicon oxide films 27, 22 at a high ratio of selection relative to the silicon nitride film 21. Besides, in order to minimize the quantities of corrosion of the semiconductor substrate 1 and the silicon oxide film 6 buried in the element isolation trenches 2, the above etching of the silicon nitride film 21 is carried out using a gas which etches the silicon nitride film 21 at a high ratio of selection relative to the silicon oxide films 6, 22. Thus, the contact hole 33 is formed in self-alignment with the element isolation trench 2.

According to the manufacturing method explained above, the silicon nitride film 9 does not overlie the gate electrode 8B of the n-channel MISFET Qn constituting the logic LSI, so that the contact hole 32 over the gate electrode 8B and the contact hole 33 over the n$^+$-type semiconductor region 16 can be formed at the same time. Besides, the silicon nitride film 9 does not overlie the gate electrode 8C of the drive MISFET Qd constituting the memory cell of the SRAM, so that the contact hole 34 can be formed over the area which extends over the gate electrode BC of the drive MISFET Qd and the p$^+$-type semiconductor region 17 of the load MISFET Qp, at the same time as the formation of the contact holes 32, 33.

Next, as shown in FIG. 18, plugs 36 are formed in the through hole 30 and contact holes 31~34. The plugs 36 are formed in such a way that a titanium nitride film and a tungsten film are deposited on the silicon oxide film 27 by CVD, and that the deposited films are flattened by CMP so as to be left behind within the through hole 30 and contact holes 31~34 only.

Next, as seen from FIG. 19, a tungsten film having a thickness of about 100 nm is deposited on the silicon oxide film 27 by CVD (or sputtering), and the deposited tungsten film is patterned. Thus, a bit line BL is formed over the through hole 30, and wiring lines 37~40 are formed over the respective contact holes 31~34.

Figure 20:
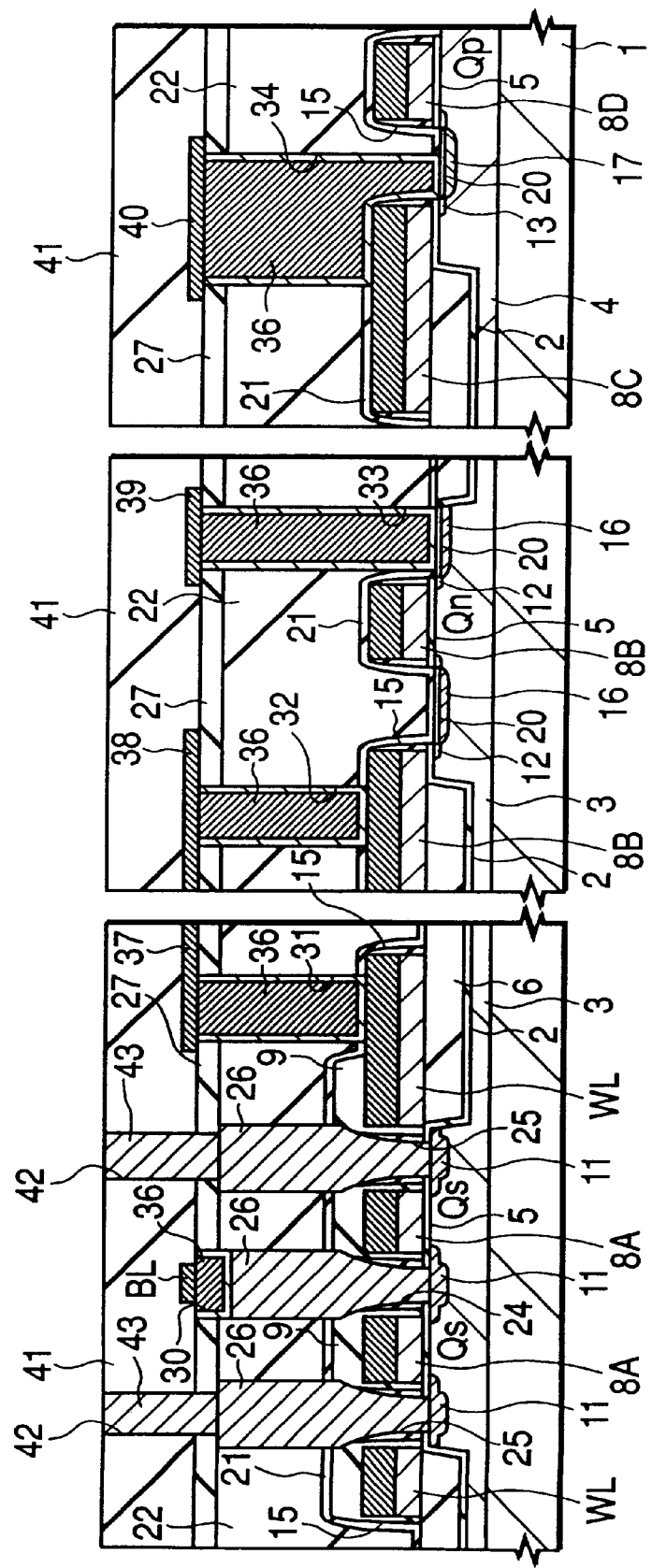
FIG. 20 is a sectional view of the essential portions of the semiconductor substrate showing the method of manufacturing the system LSI in Embodiment 1 of the present invention.

Next, as shown in FIG. 20, a silicon oxide film 41 having a thickness of about 300 nm is deposited by CVD on the semiconductor substrate 1 including the bit line BL and wiring lines 37~40, and the silicon oxide film 41 and silicon oxide film 27 are etched using a photoresist film as a mask, thereby to form through holes 42 on the contact holes 25. Subsequently, plugs 43 comprised of a polycrystal silicon film are formed within the through holes 42 by the same method as in the formation of the plugs 26 within the contact holes 24, 25.

Figure 21:
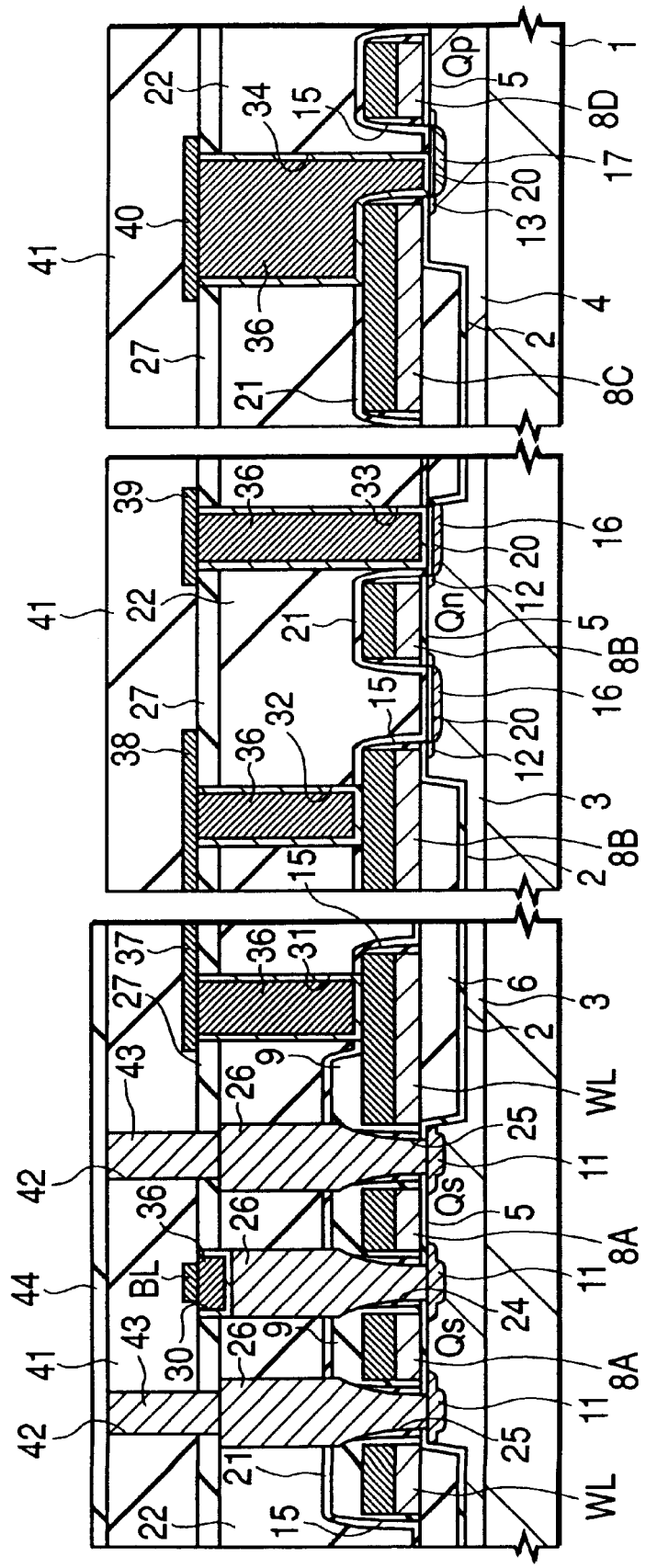
FIG. 21 is a sectional view of the essential portions of the semiconductor substrate showing the method of manufacturing the system LSI in Embodiment 1 of the present invention.

At the next step, as shown in FIG. 21, a silicon nitride film 44 having a thickness of about 200 nm is deposited on the silicon oxide film 41 by CVD, and the deposited silicon nitride film 44 in the areas other than the DRAM forming area is removed by etching which employs a photoresist film as a mask. The silicon nitride film 44 remaining in the DRAM forming area is to be used as an etching stopper in the case of etching a silicon oxide film (45) at the later step of forming the lower electrodes 47 of information storing capacitors (or capacitance elements) C.

Figure 22:
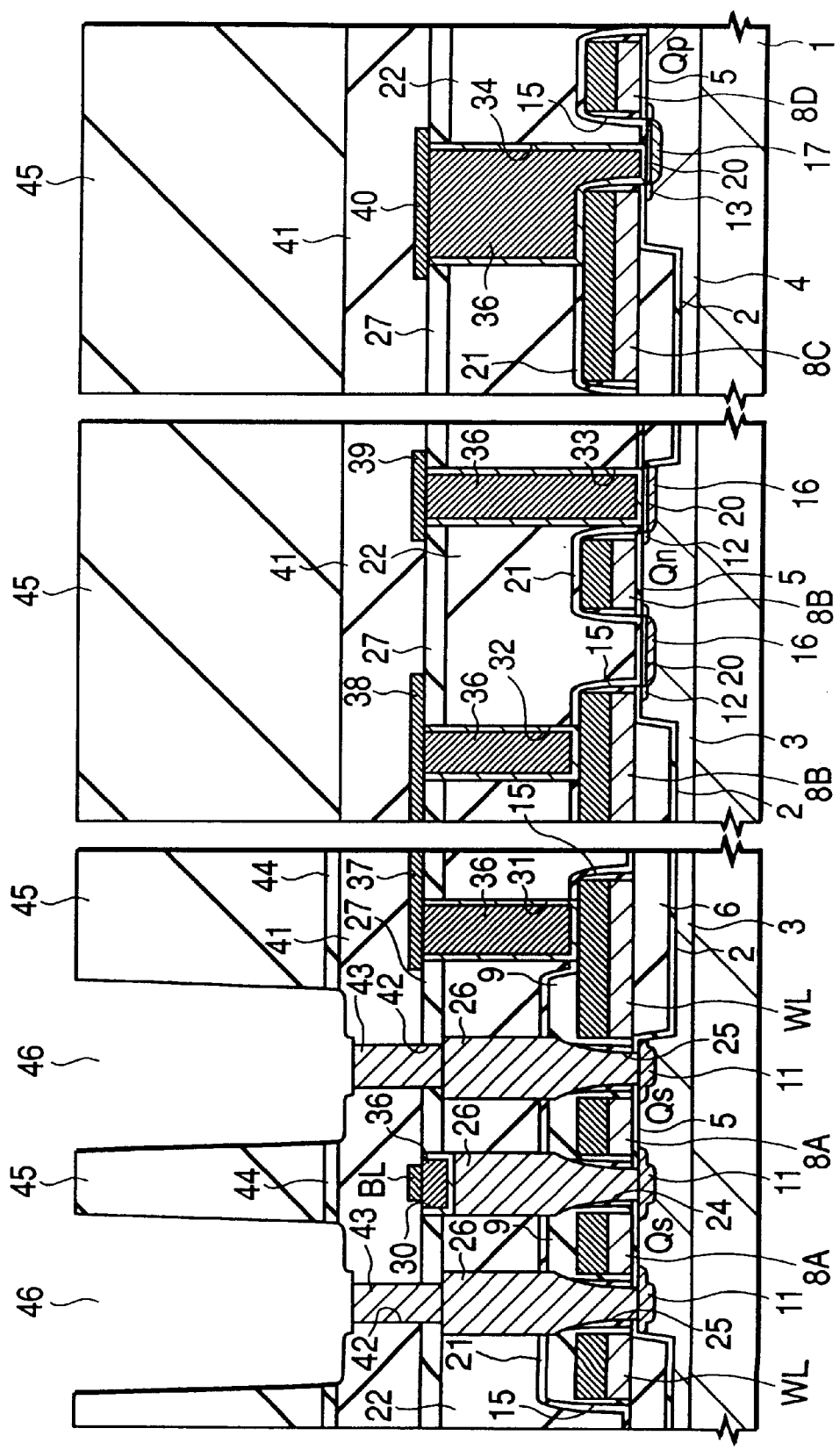
FIG. 22 is a sectional view of the essential portions of the semiconductor substrate showing the method of manufacturing the system LSI in Embodiment 1 of the present invention.

Next, as shown in FIG. 22, the silicon oxide film 45 is deposited by CVD on the semiconductor substrate 1 which includes the remaining silicon nitride film 44. Thereafter, the silicon oxide film 45 and the silicon nitride film 44 are etched using a photoresist film as a mask. Thus, recesses 46 are formed on the through holes 42. Since the lower electrode 47 of each information storing capacitor C is formed along the inwall of the recess 46, the silicon oxide film 45 is deposited as a thick film (being, for example, about 1.3 $\mu$m thick) in order to increase the quantity of electric charges to-be-stored by enlarging the surface area of the lower electrode 47.

Figure 23:
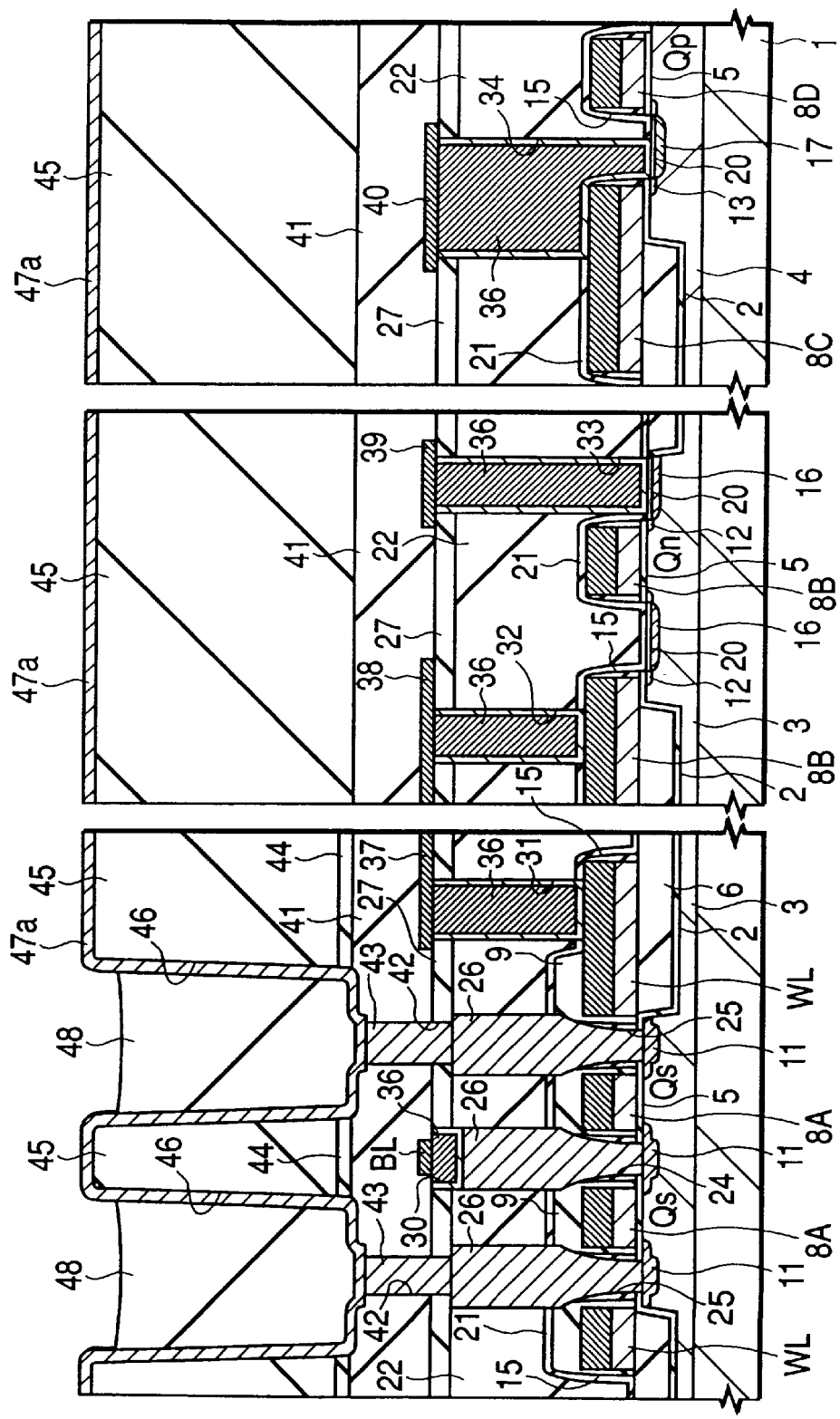
FIG. 23 is a sectional view of the essential portions of the semiconductor substrate showing the method of manufacturing the system LSI in Embodiment 1 of the present invention.

Next, as shown in FIG. 23, a polycrystal silicon film 47a doped with an n-type impurity (for example, phosphorus) and having a thickness of about 60 nm is deposited by CVD on the silicon oxide film 45 which includes the inside parts of the recesses 46. The polycrystal silicon film 47a is to be used as the lower electrode material of the information storing capacitors C. Subsequently, the polycrystal silicon film 47a is covered with a spin-on-glass film 48 being about 300 nm thick by spin coating, and the spin-on-glass film 48 is etched back (or flattened by CMP) so as to be left behind in the recesses 46 only.

Figure 24:
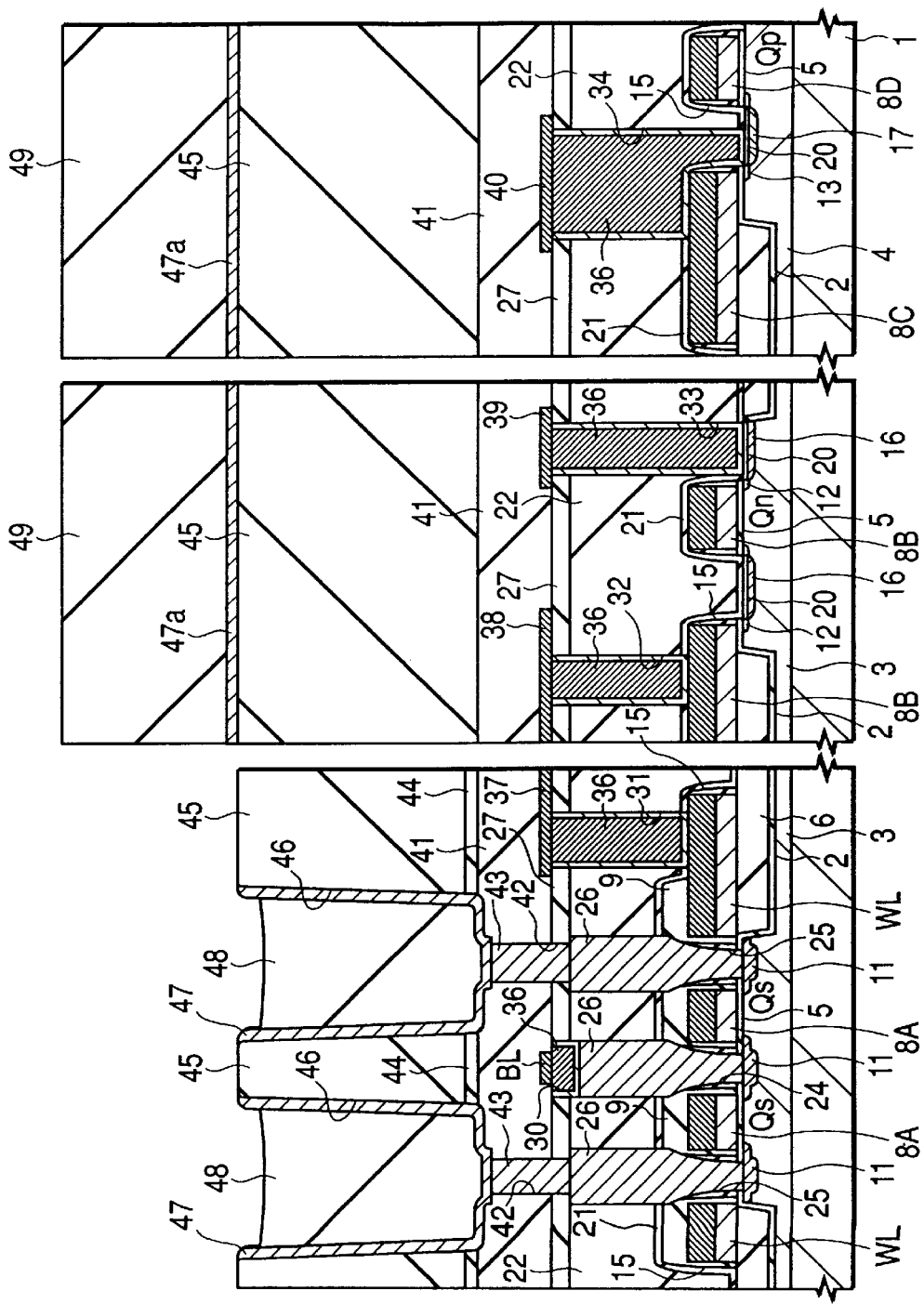
FIG. 24 is a sectional view of the essential portions of the semiconductor substrate showing the method of manufacturing the system LSI in Embodiment 1 of the present invention.

Subsequently, as shown in FIG. 24, the polycrystal silicon film 47a in the areas other than the DRAM forming area is covered with a photoresist film 49, and the polycrystal silicon film 47a lying on the silicon oxide film 45 in the DRAM forming area is removed by etching, thereby to form the lower electrodes 47 extending along the inwalls of the recesses 46. Incidentally, the lower electrodes 47 may well be formed using an electrically conductive material different from polycrystal silicon, for example, a refractory metal such as tungsten or ruthenium, or a conductive metal oxide such as ruthenium oxide or iridium oxide. In addition, the surface area of each lower electrode 47 may well be enlarged still more by roughening the surface thereof.

Figure 25:
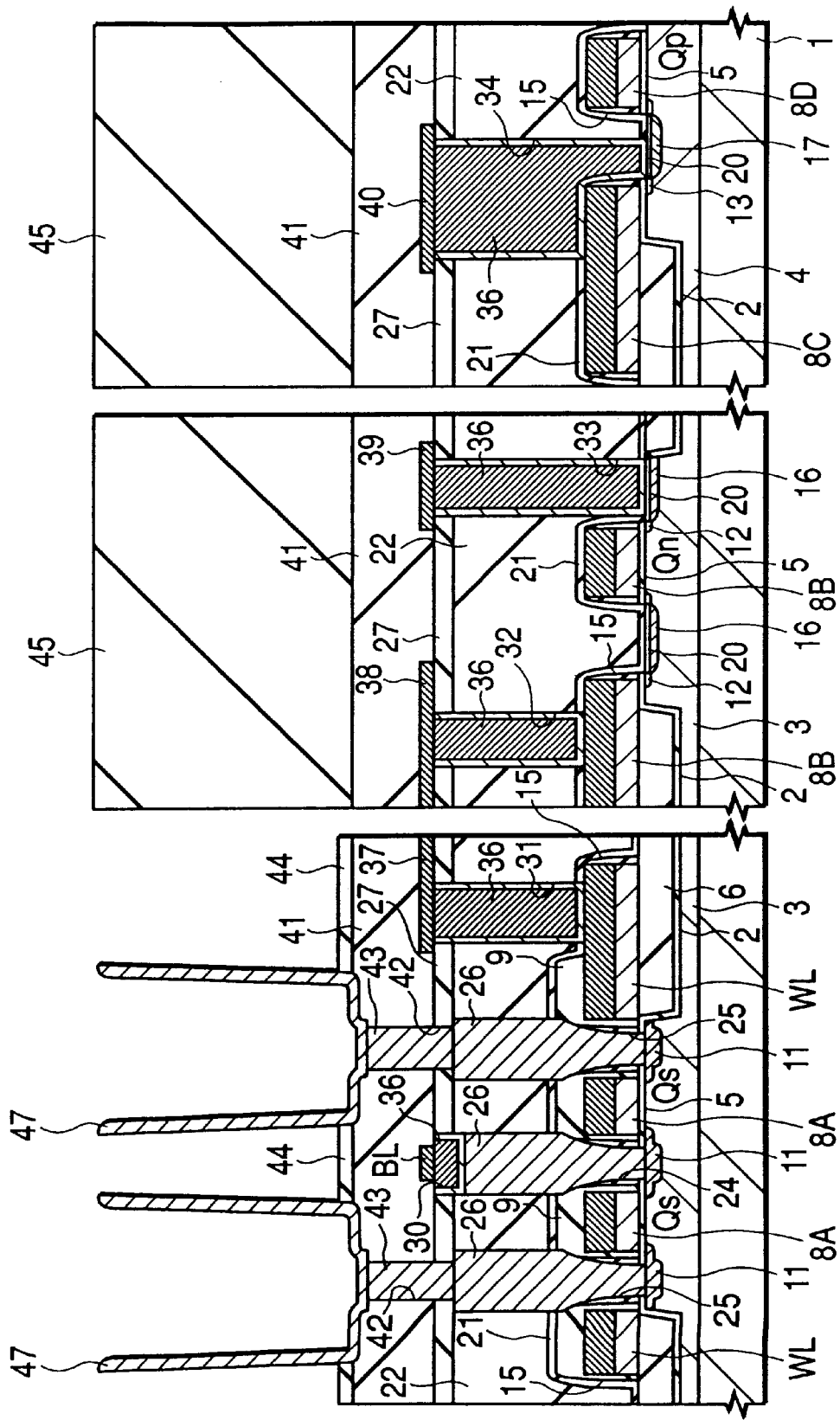
FIG. 25 is a sectional view of the essential portions of the semiconductor substrate showing the method of manufacturing the system LSI in Embodiment 1 of the present invention.

Subsequently, as shown in FIG. 25, the silicon oxide film 45 remaining in the interspace between the recesses 46, 46 adjacent to each other, and the spin-on-glass film 48 remaining inside the recesses 46 are removed with an etchant which is based on fluoric acid. Thereafter, the photoresist film and polycrystal silicon film 47a in the areas other than the DRAM forming area are removed by etching which employs a photoresist film as a mask. Thus, the lower electrodes 47 each being in the shape of a cylinder are finished. Since the silicon nitride film 44 is formed at the bottom of the silicon oxide film 45 in the interspace between the adjacent recesses 46, 46, the silicon oxide film 41 underlying the silicon oxide film 45 is not etched on the occasion of the wet etching of this silicon oxide film 45. Since, on this occasion, the polycrystal silicon film 47a is formed on the silicon oxide film 45 in the areas other than the DRAM forming area, the silicon oxide film 45 in the other areas is not etched, either.

Figure 26:
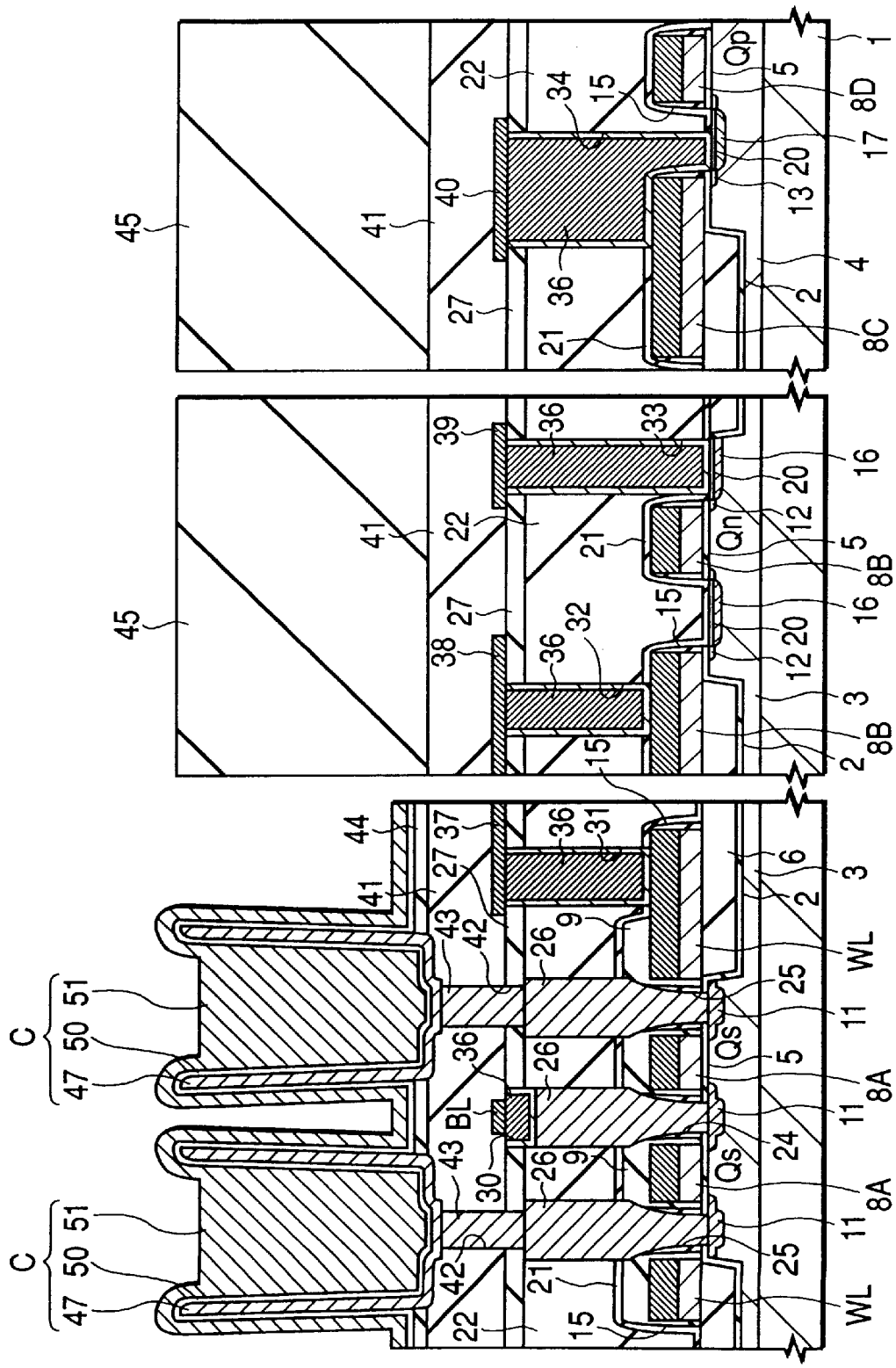
FIG. 26 is a sectional view of the essential portions of the semiconductor substrate showing the method of manufacturing the system LSI in Embodiment 1 of the present invention.

Next, as shown in FIG. 26, a thin tantalum oxide film 50 having a thickness of about 14 nm is deposited on each lower electrode 47 by CVD. Subsequently, a titanium nitride film is deposited on the tantalum oxide film 50 by, for example, the conjoint use of CVD and sputtering. Thereafter, the titanium nitride film and the tantalum oxide film 50 are patterned by etching which employs a photoresist film as a mask. Thus, there are finished the information storing capacitors C of the DRAM, each of which includes an upper electrode 51 comprised of the titanium nitride film, a capacitance insulator film comprised of the tantalum oxide film 50, and the lower electrode 47 comprised of the polycrystal silicon film (47a). Incidentally, the capacitance insulator film of the information storing capacitor C can alternatively be comprised of a ferroelectric material, for example, any of metal oxides such as BST, STO, BaTiO$_3$ (barium titanate), PbTiO$_3$ (lead titanate), PZT (PbZr$_x$Ti$_{1-x}$O$_3$), PLT (PbLa$_x$Ti$_{1-x}$O$_3$), and PLZT. Also, the upper electrode 51 can be formed using an electrically conductive material different from titanium nitride, for example, tungsten. Further, the information storing capacitor C can be brought into a shape different from the cylindrical shape, for example, a fin shape.

Figure 27:
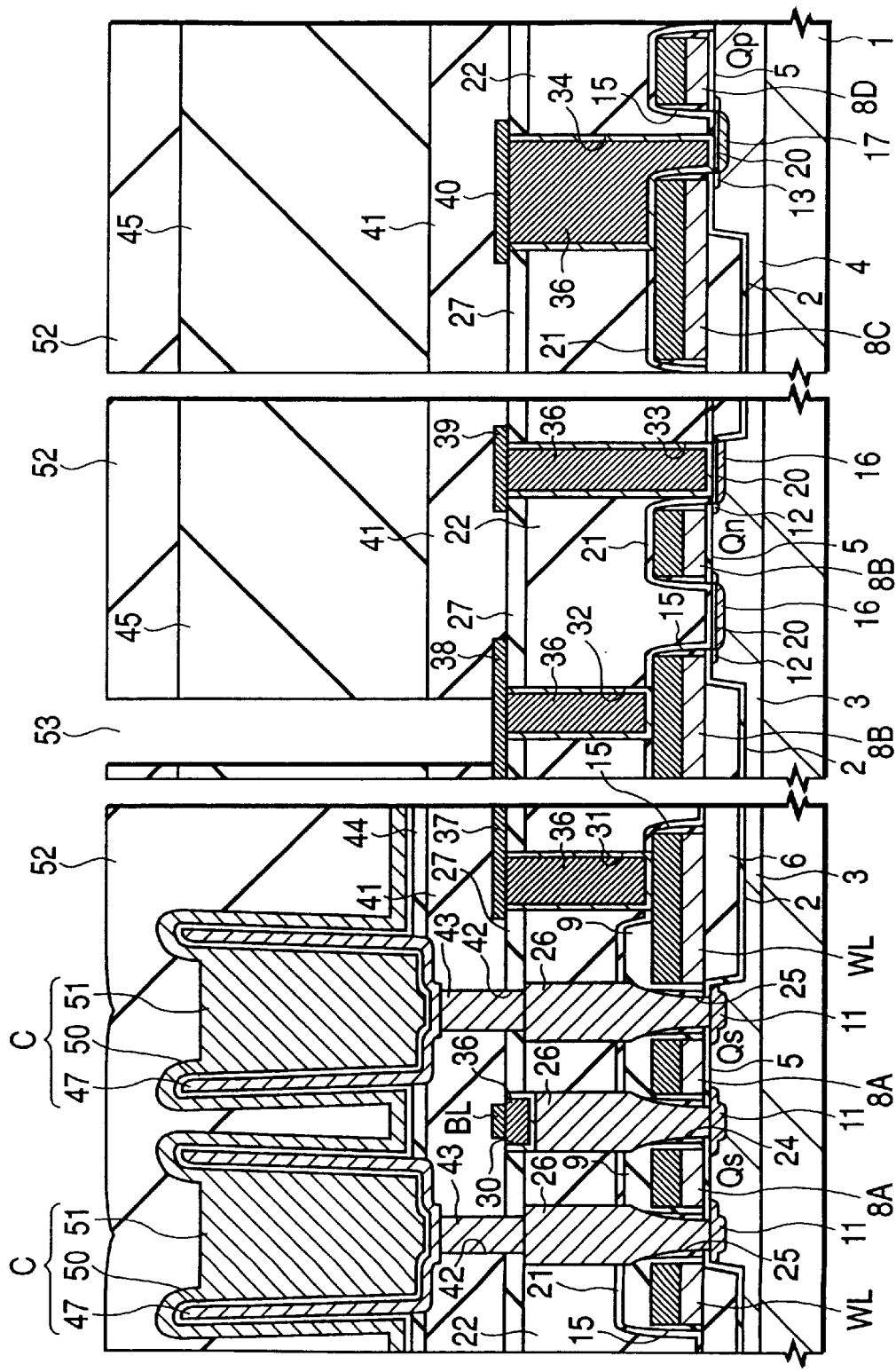
FIG. 27 is a sectional view of the essential portions of the semiconductor substrate showing the method of manufacturing the system LSI in Embodiment 1 of the present invention.

Subsequently, as shown in FIG. 27, a silicon oxide film 52 having a thickness of about 600 nm is deposited by CVD on the semiconductor substrate 1 including the information storing capacitors C. Thereafter, the silicon oxide film 52 and the underlying silicon oxide films 45, 41 are etched using a photoresist film as a mask. Thus, a through hole 53 is formed on the wiring line 38 of first layer.

Figure 28:
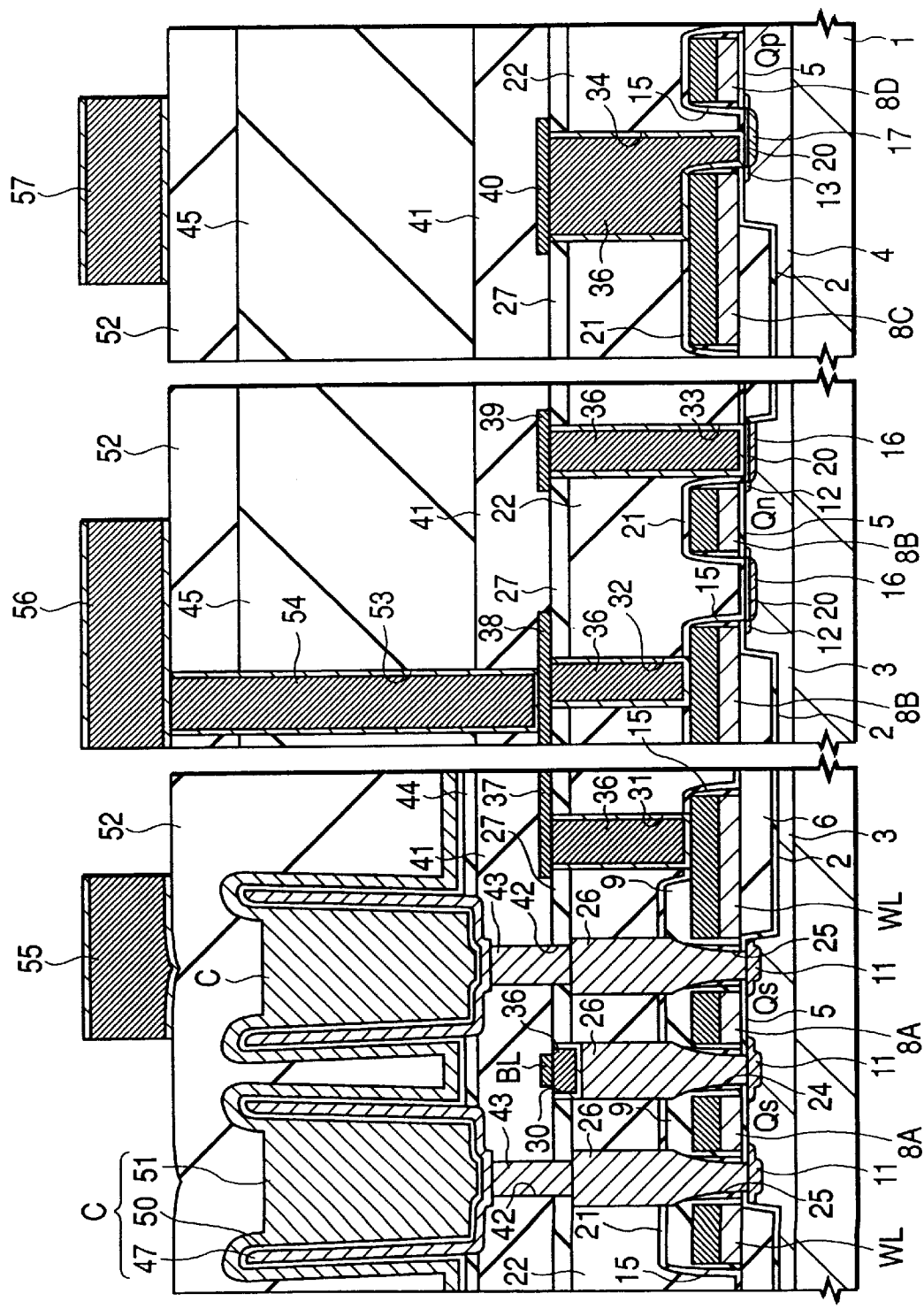
FIG. 28 is a sectional view of the essential portions of the semiconductor substrate showing the method of manufacturing the system LSI in Embodiment 1 of the present invention.

Subsequently, as shown in FIG. 28, a plug 54 is formed inside the through hole 53, and wiring lines 55 57 of second layer are formed on the silicon oxide film 52. The plug 54 is formed, for example, in such a way that a titanium nitride film and a W (tungsten) film are deposited on the silicon oxide film 52 by CVD, and that the deposited films are etched back so as to be left behind within the through hole 53 only. Besides, the second-layer wiring lines 55~57 are formed, for example, in such a way that a Ti (titanium) film being about 50 nm thick, an Al (aluminum) film being about 500 nm thick, a Ti film being about 50 nm thick, and a titanium nitride film being about 50 nm thick are successively deposited on the silicon oxide film 52 by sputtering, and that these films are patterned by dry etching which employs a photoresist film as a mask.

Although not shown, wiring lines of one layer or two layers are thereafter formed on the second-layer wiring lines 55~57 through one or two interlayer insulator layers, and they are further overlaid with a dense passivation film of high water-resisting property (for example, a two-layered insulator film consisting of a silicon oxide film and a silicon nitride film deposited by plasma CVD). Thus, the system LSI of this embodiment is substantially finished.

In this manner, according to the manufacturing method of Embodiment 1, the silicon nitride film 9 is left behind on only the regions for forming the gate electrodes 8A (word lines WL) of the memory-cell selecting MISFETs of the DRAM, whereupon these gate electrodes 8A (word lines WL) and the gate electrodes 8B~8D of the logic LSI and SRAM are patterned and formed at the same time by etching which employs the remaining silicon nitride film 9 and the photoresist film 10 as the mask.

In this way, the contact hole 32 over the gate electrode 8B of the n-channel MISFET Qn constituting the logic LSI, and the contact hole 33 over the n⁺-type semiconductor region 16 (source or drain) can be formed at the same time.

Moreover, according to the manufacturing method of Embodiment 1, the machining of the gate electrodes 8A (word lines WL) overlaid with the silicon nitride film 9 and that of the gate electrodes 8B~8D not overlaid with the same 9 are carried out at the same time, and hence, increase in the number of processing steps is substantially negligible.
(Embodiment 2)

A method of manufacturing a system LSI in this embodiment will be described in the order of the steps thereof with reference to FIG. 29~FIG. 39 (sectional views of a semiconductor substrate). The left area of each of these figures illustrates part of a DRAM forming area (or illustrates only memory cells), the middle area illustrates part of a logic LSI forming area (or illustrates only an n-channel MISFET), and the right area illustrates part of an SRAM forming area (or illustrates only part of each of a drive MISFET and a load MISFET).

First, as shown in FIG. 29, element isolation trenches 2, a p-type well 3 and an n-type well 4 are formed in the principal surface of a semiconductor substrate 1 by the same processes as in Embodiment 1. Subsequently, a gate oxide film 5 is formed on the surfaces of the active regions of the p-type well 3 and n-type well 4. Thereafter, a conductor film 8 for gate electrodes, comprised of a poly-cide film, a poly-metal film or the like, is formed on the gate oxide film 5.

Next, as shown in FIG. 30, the conductor film 8 for the gate electrodes is patterned by etching with a photoresist film 60 employed as a mask, thereby to form the gate electrode 8B of the n-channel MISFET Qn of a logic LSI, and the gate electrode 8C of the drive MISFET Qd of an SRAM and the gate electrode 8D of the load MISFET Qp thereof. On this occasion, that part of the conductor film 8 for the gate electrodes which lies in the DRAM forming area is kept covered with the photoresist film 60 without being patterned.

Next, as shown in FIG. 31, the ions of an n-type impurity (for example, phosphorus) are implanted into the p-type well 3, thereby to form n⁻-type semiconductor regions 12 in those parts of the p-type well 3 which lie on both the sides of the gate electrode 8B of the n-channel MISFET Qn. Likewise, the ions of a p-type impurity (for example, boron) are implanted into the n-type well 4, thereby to form p⁻-type semiconductor regions 13 in those parts of the n-type well 4 which lie on both the sides of the gate electrode 8D of the load MISFET Qp.

At the next step, as seen from FIG. 32, a silicon nitride film deposited on the semiconductor substrate 1 by CVD is machined by anisotropic etching, thereby to form side wall spacers 15 comprised of the silicon nitride film on the side walls of each of the gate electrodes 8B~8D. Subsequently, the ions of an n-type impurity (for example, phosphorus) are implanted into the p-type well 3 in the logic LSI forming area, thereby to form n⁺-type semiconductor regions 16 in those parts of the p-type well 3 which lie on both the sides of the gate electrode 8B of the n-channel MISFET Qn. Besides, the ions of a p-type impurity (for example, boron) are implanted into the n-type well 4 in the SRAM forming area, thereby to form p⁺-type semiconductor regions 17 in those parts of the n-type well 4 which lie on both the sides of the gate electrode 8D of the load MISFET Qp. Owing to the steps thus far explained, the n-channel MISFET Qn of the logic LSI and the load MISFET Qp of the SRAM are finished.

Figure 33:
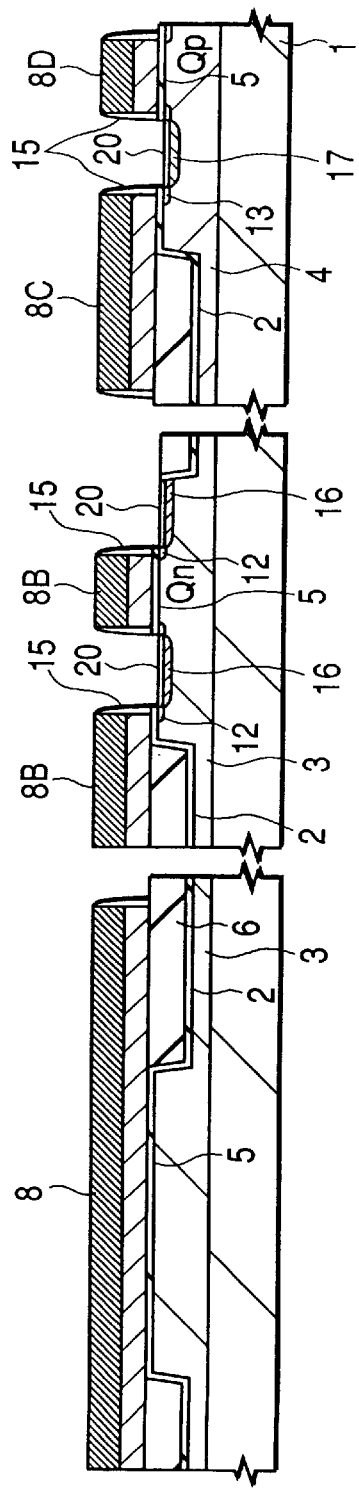
FIG. 33 is a sectional view of the essential portions of the semiconductor substrate showing the method of manufacturing the system LSI in Embodiment 2 of the present invention.

Subsequently, as seen from FIG. 33, the surface of the semiconductor substrate 1 is thinly or slightly etched using an etchant based on fluoric acid, thereby to denude the source and drain (n⁺-type semiconductor regions 16) of the n-channel MISFET Qn and the source and drain (p⁺-type semiconductor regions 17) of the load MISFET Qp. Thereafter, a Co silicide layer 20 is formed on the surfaces of these sources and drains by the same process as in Embodiment 1.

Figure 34:
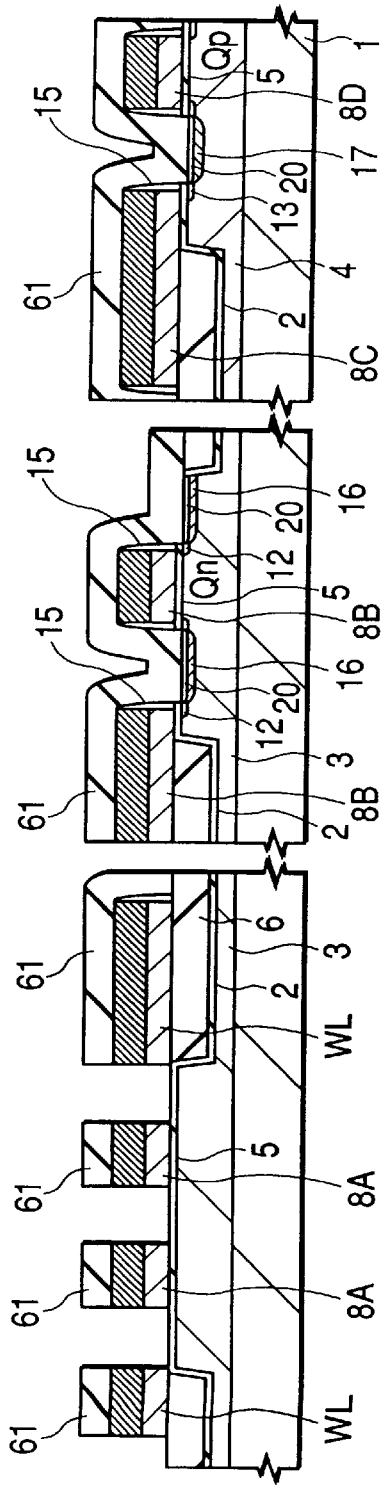
FIG. 34 is a sectional view of the essential portions of the semiconductor substrate showing the method of manufacturing the system LSI in Embodiment 2 of the present invention.

Subsequently, as shown in FIG. 34, a silicon nitride film 61 being about 100 nm thick is deposited on the semiconductor substrate 1 by CVD. Thereafter, the silicon nitride film 61 is first patterned by etching with a photoresist film employed as a mask, the photoresist film is subsequently removed, and the conductor film 8 for the gate electrodes is subsequently patterned by etching with the silicon nitride film 61 employed as a mask. Thus, the gate electrodes 8A (word lines WL) of memory-cell selecting MISFETs Qs are formed in the DRAM forming area.

Figure 35:
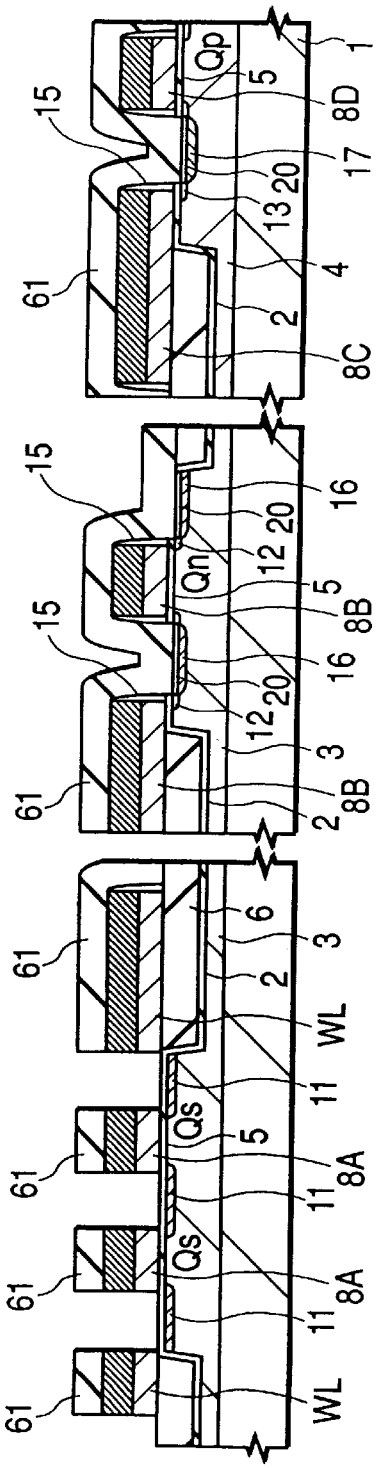
FIG. 35 is a sectional view of the essential portions of the semiconductor substrate showing the method of manufacturing the system LSI in Embodiment 2 of the present invention.

Next, as seen from FIG. 35, the ions of an n-type impurity (for example, phosphorus) are implanted into the p-type well 3 in the DRAM forming area, thereby to form n-type semiconductor regions 11 which make up the source and drain of the memory-cell selecting MISFETs Qs. Owing to the steps thus far explained, the memory-cell selecting MISFETs Qs of a DRAM are substantially finished.

Figure 36:
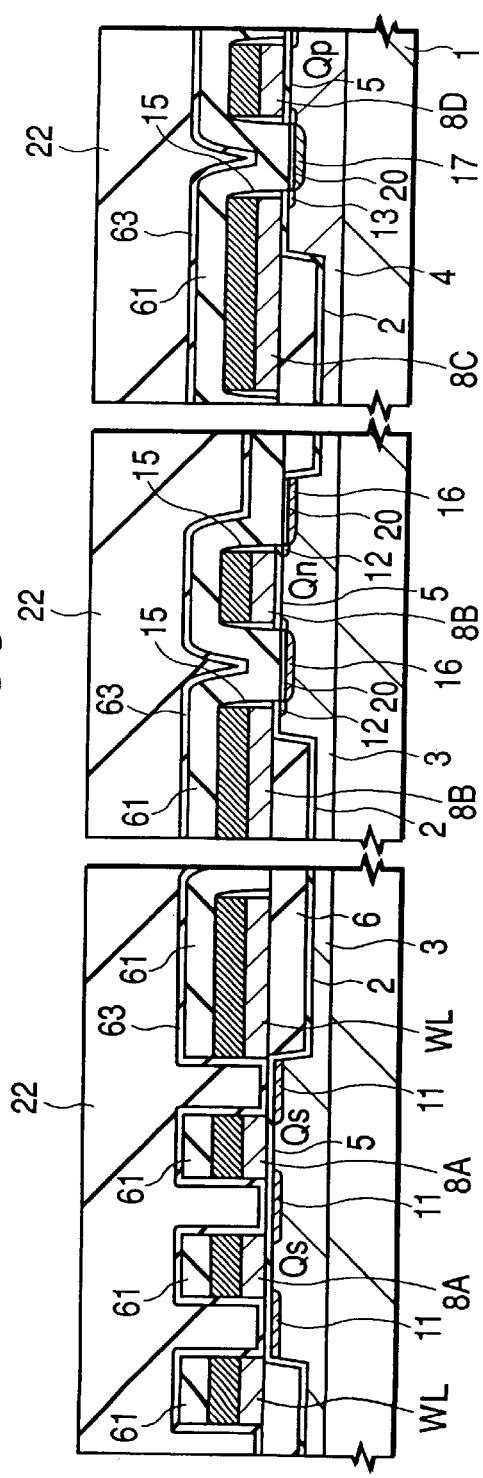
FIG. 36 is a sectional view of the essential portions of the semiconductor substrate showing the method of manufacturing the system LSI in Embodiment 2 of the present invention.

Next, as shown in FIG. 36, a silicon nitride film 63 being about 50 nm thick is deposited on the semiconductor substrate 1 by CVD. Subsequently, a silicon oxide film 22 being about 600 nm thick is deposited on the silicon nitride film 63 by CVD, and the surface of the silicon oxide film 22 is flattened by CMP.

Next, as shown in FIG. 37, the same processes as in Embodiment 1 are used to etch those parts of the silicon oxide film 22 which overlie the source and drain (n-type semiconductor regions 11) of the memory-cell selecting MISFETs Qs, and to etch those parts of the silicon nitride films 63, 61 which underlie the silicon oxide film 22. Thus, a contact hole 64 is formed on either of the source and drain (n-type semiconductor regions 11) of each MISFET Qs, and a contact hole 65 is formed on the other.

In order to prevent the removal of the silicon nitride films 63, 61 underlying the silicon oxide film 22, the above etching of the silicon oxide film 22 is carried out using a gas which etches the silicon oxide films 22 at a high ratio of selection relative to the silicon nitride films 63, 61. Besides, in order to minimize the quantity of corrosion or excavation of the semiconductor substrate 1, the above etching of the silicon nitride films 63, 61 is carried out using a gas which etches the silicon nitride films 63, 61 at a high ratio of selection relative to silicon and a silicon oxide films. In addition, this etching is carried out under conditions adapted to anisotropically etch the silicon nitride film 63, so as to leave the silicon nitride film 63 behind on the side walls of the gate electrodes 8A (word lines WL). Thus, the contact holes 64, 65 are formed in self-alignment with these gate electrodes 8A (word lines WL).

Next, as shown in FIG. 38, plugs 66 comprised of a polycrystal silicon film are formed inside the contact holes 64, 65 by the same process as in Embodiment 1, a silicon oxide film 27 being about 200 nm thick is deposited on the silicon oxide film 22 by CVD, and the semiconductor substrate 1 is heat-treated in an atmosphere of inert gas. Thus, the resistances of the n-type semiconductor regions 11 (source and drain) of each memory-cell selecting MISFET Qs are lowered.

Figure 39:
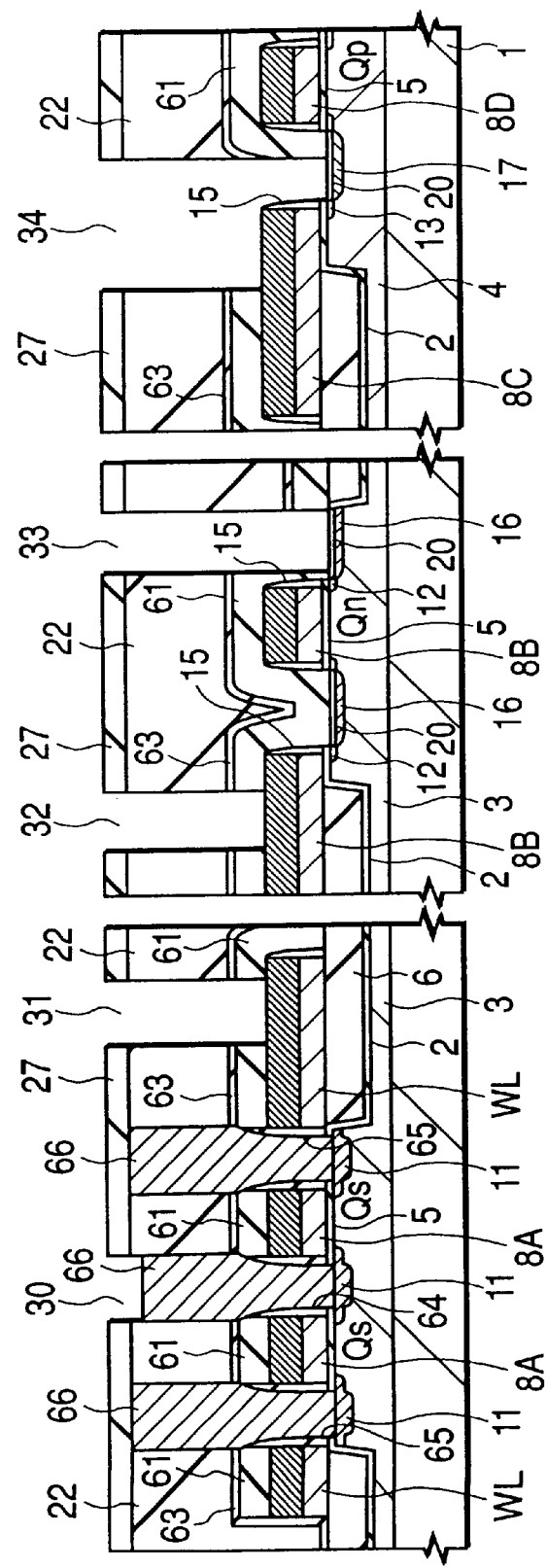
FIG. 39 is a sectional view of the essential portions of the semiconductor substrate showing the method of manufacturing the system LSI in Embodiment 2 of the present invention.

At the next step, as shown in FIG. 39, a through hole 30 is formed on the contact hole 64 by etching the silicon oxide film 27 with a photoresist film used as a mask. Subsequently, the silicon oxide film 27 and the silicon oxide film 22 are etched with a photoresist film used as a mask, followed by the etching of the silicon nitride films 63, 61. Thus, a contact hole 31 is formed on the wiring lead-out area of the word line WL, contact holes 32, 33 are respectively formed on the gate electrode 8B and the $n^+$-type semiconductor region 16 of the n-channel MISFET Qn, and a contact hole 34 is formed on an area which extends over the gate electrode 8C of the drive MISFET Qd and the $p^+$-type semiconductor region 17 of the load MISFET Qp.

In order to prevent the removal of the underlying silicon nitride films 63, 61, the above etching of the silicon oxide film 27 and silicon oxide film 22 is carried out using a gas which etches the silicon oxide films 27, 22 at a high ratio of selection relative to the silicon nitride films 63, 61. Besides, in order to minimize the quantities of corrosion or excavation of the semiconductor substrate 1 and the silicon oxide film 6 buried in the element isolation trenches 2, the above etching of the silicon nitride films 63, 61 is carried out using a gas which etches the silicon nitride films 63, 61 at a high ratio of selection relative to silicon and a silicon oxide films. Thus, the contact hole 33 is formed in self-alignment with the element isolation trench 2. The succeeding steps are substantially the same as in Embodiment 1.

In this manner, according to the manufacturing method of Embodiment 2, the silicon nitride films 61, 63 for forming the contact holes 64, 65 (gate-SAC) in self-alignment with the gate electrodes 8A (word lines WL) in the DRAM forming area are also utilized as the silicon nitride films 61, 63 for forming the contact hole 33 (L-SAC) in self-alignment with the element isolation trench 2 in the logic LSI forming area. Thus, the silicon nitride films 61, 63 having nearly equal thicknesses are existent on the gate electrode 8B and $n^+$-type semiconductor region 16 of the n-channel MISFET Qn constituting the logic LSI. Therefore, the contact hole 32 on the gate electrode 8B and the contact hole 33 on the $n^+$-type semiconductor region 16 can be formed at the same time.

Besides, the silicon nitride films 61, 63 are existent on the gate electrode 8C of the drive MISFET Qd constituting the memory cell of the SRAM. In forming the contact holes 32, 33, therefore, the contact hole 34 can be formed on the area extending over the gate electrode 8C of the drive MISFET Qd and the $p^+$-type semiconductor region 17 of the load MISFET Qp, at the same time.

Moreover, according to the manufacturing method of Embodiment 2, the silicon nitride films 61, 63 being comparatively thick are existent on the top part and side walls of the n-channel MISFET Qn constituting the logic LSI. Therefore, the contact hole 33 can be formed in self-alignment with, not only the element isolation trench 2, but also the gate electrode 8B.

(Embodiment 3)

A method of manufacturing a system LSI in this embodiment will be described in the order of the steps thereof with reference to FIG. 40~FIG. 47 (sectional views of a semiconductor substrate). The left area of each of these figures illustrates part of a DRAM forming area (or illustrates only memory cells), the middle area illustrates part of a logic LSI forming area (or illustrates only an n-channel MISFET), and the right area illustrates part of an SRAM forming area (or illustrates only part of each of a drive MISFET and a load MISFET).

Figure 40:
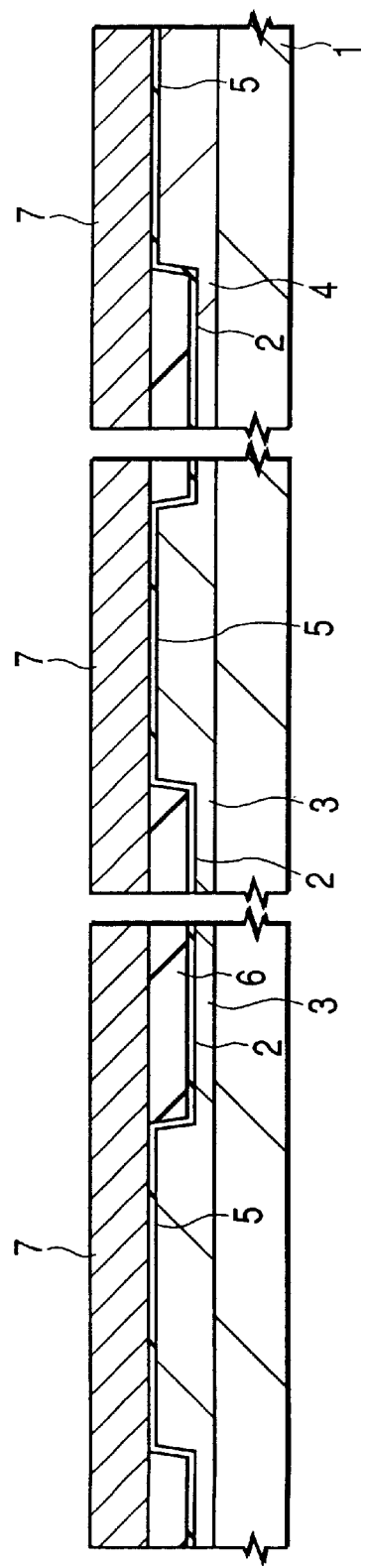
FIG. 40 is a sectional view of the essential portions of a semiconductor substrate showing a method of manufacturing a system LSI in Embodiment 3 of the present invention.

First, as shown in FIG. 40, element isolation trenches 2, a p-type well 3 and an n-type well 4 are formed in the principal surface of a semiconductor substrate 1 by the same processes as in Embodiment 1. Subsequently, a gate oxide film 5 is formed on the surfaces of the active regions of the p-type well 3 and n-type well 4. Thereafter, a polycrystal silicon film 7 doped with an n-type impurity (for example, arsenic) is deposited on the gate oxide film 5 by CVD. By the way, in a case where an n-channel MISFET and a p-channel MISFET are fabricated into a dual gate structure, a polycrystal silicon film 7 containing no impurity is deposited, followed by doping the polycrystal silicon film 7 in an n-channel MISFET forming area with an n-type impurity (for example, arsenic) and doping the polycrystal silicon film 7 in a p-channel MISFET forming area with a p-type impurity (for example, boron).

Figure 41:
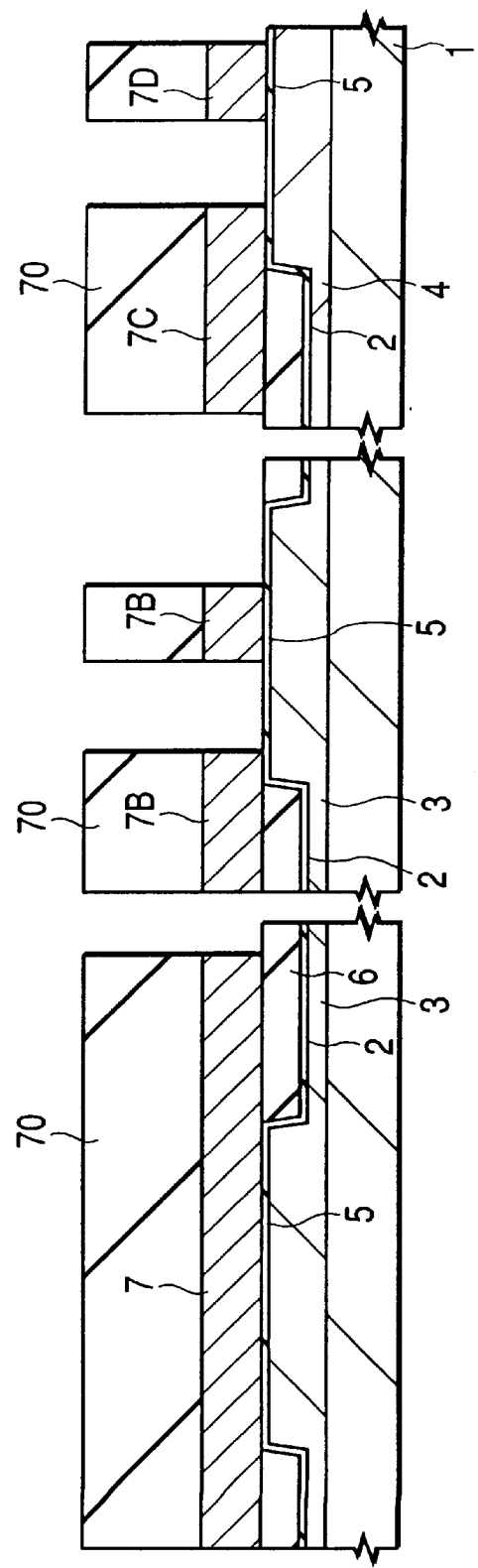
FIG. 41 is a sectional view of the essential portions of the semiconductor substrate showing the method of manufacturing the system LSI in Embodiment 3 of the present invention.

Next, as shown in FIG. 41, the polycrystal silicon film 7 is patterned by etching with a photoresist film 70 employed as a mask, thereby to form a gate electrode 7B of each n-channel MISFET Qn of the logic LSI, and the gate electrode 7C of the drive MISFET Qd of an SRAM and the gate electrode 7D of the load MISFET Qp thereof. On this occasion, the polycrystal silicon film 7 in the DRAM forming area is kept covered with the photoresist film 70 without being patterned.

Figure 42:
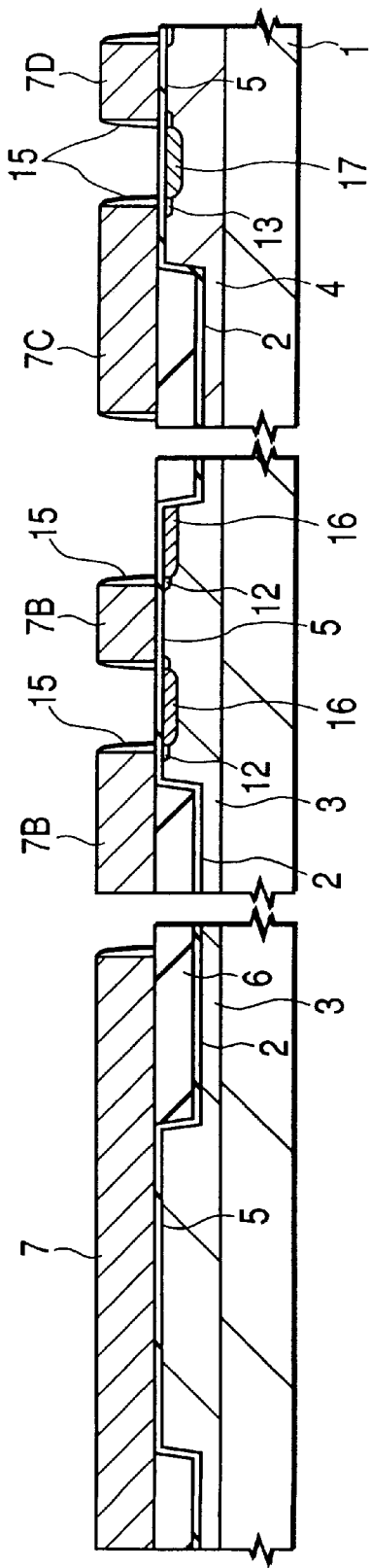
FIG. 42 is a sectional view of the essential portions of the semiconductor substrate showing the method of manufacturing the system LSI in Embodiment 3 of the present invention.

Next, as shown in FIG. 42, the ions of an n-type impurity (for example, phosphorus) are implanted into the p-type well 3, thereby to form $n^-$-type semiconductor regions 12 in those parts of the p-type well 3 which lie on both the sides of the gate electrode 7B of the n-channel MISFET Qn. Besides, the ions of a p-type impurity (for example, boron) are implanted into the n-type well 4, thereby to form $p^-$-type semiconductor regions 13 in those parts of the n-type well 4 which lie on both the sides of the gate electrode 7D of the load MISFET Qp.

Subsequently, a silicon nitride film deposited on the semiconductor substrate 1 by CVD is machined by anisotropic etching, thereby to form side wall spacers 15 comprised of the silicon nitride film on the side walls of each of the gate electrodes 7B~7D. Thereafter, the ions of an n-type impurity (for example, phosphorus) are implanted into the p-type well 3 in the logic LSI forming area, thereby to form $n^+$-type semiconductor regions 16 in those parts of the p-type well 3 which lie on both the sides of the gate electrode 7B of the n-channel MISFET Qn. Besides, the ions of a p-type impurity (for example, boron) are implanted into the n-type well 4 in the SRAM forming area, thereby to form $p^+$-type semiconductor regions 17 in those parts of the n-type well 4 which lie on both the sides of the gate electrode 7D of the load MISFET QP.

Figure 43:
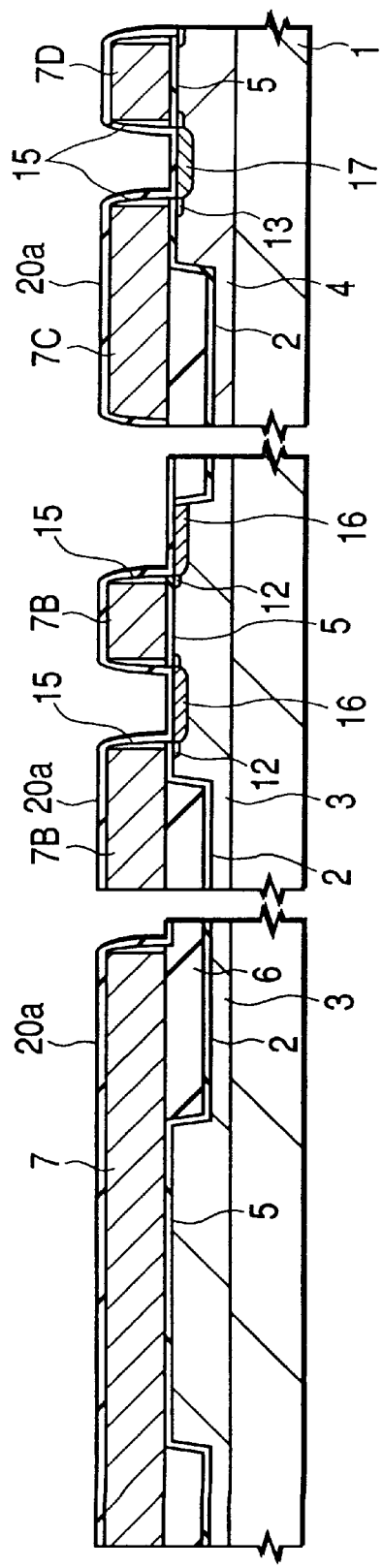
FIG. 43 is a sectional view of the essential portions of the semiconductor substrate showing the method of manufacturing the system LSI in Embodiment 3 of the present invention.

At the next step, as seen from FIG. 43, the surface of the semiconductor substrate 1 is thinly or slightly etched using an etchant based on fluoric acid, thereby to denude the source and drain ($n^+$-type semiconductor regions 16) of the n-channel MISFET Qn and the source and drain ($p^+$-type semiconductor regions 17) of the load MISFET Qp. Thereafter, a Co silicide layer 20a is deposited on the semiconductor substrate 1 by sputtering.

Figure 44:
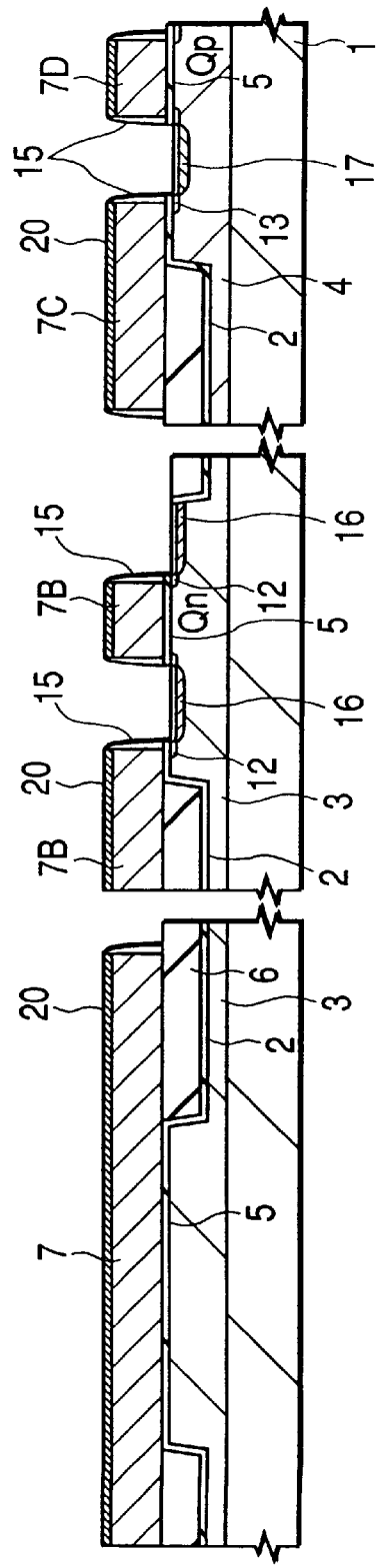
FIG. 44 is a sectional view of the essential portions of the semiconductor substrate showing the method of manufacturing the system LSI in Embodiment 3 of the present invention.

Next, as seen from FIG. 44, the resulting semiconductor substrate 1 is heat-treated. Thus, a Co silicide layer 20 is formed on the surfaces of the source and drain ($n^+$-type semiconductor regions 16) of the n-channel MISFET Qn and the source and drain ($p^+$-type semiconductor regions 17) of the load MISFET Qp. At this time, the Co silicide layer 20 is simultaneously formed on the surfaces of the polycrystal silicon films (7) making up the gate electrode 7B of each n-channel MISFET Qn of the logic LSI, and the gate electrode 7C of the drive MISFET Qd of the SRAM and the gate electrode 7D of the load MISFET Qp thereof, and on the surface of the polycrystal silicon film 7 remaining in the DRAM forming area. Owing to the steps thus far explained, there are substantially finished the n-channel MISFET Qn which has the gate electrode 7B of poly-cide structure including the polycrystal silicon film 7 and the Co silicide layer 20, and the load MISFET Qp which has the gate electrode 7D of poly-cide structure including the polycrystal silicon film 7 and the Co silicide layer 20.

Figure 45:
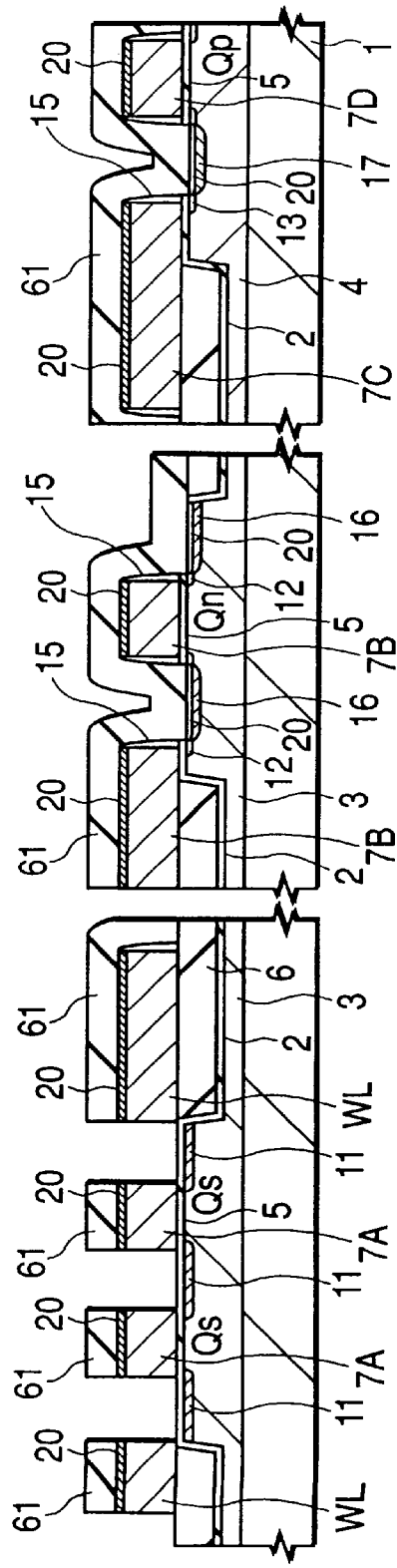
FIG. 45 is a sectional view of the essential portions of the semiconductor substrate showing the method of manufacturing the system LSI in Embodiment 3 of the present invention.

Next, as shown in FIG. 45, a silicon nitride film 61 is deposited on the semiconductor substrate 1 by CVD. Thereafter, the silicon nitride film 61 is first patterned by etching with a photoresist film employed as a mask, the photoresist film is subsequently removed, and the Co silicide layer 20 and polycrystal silicon film 7 in the DRAM forming area are subsequently patterned by etching with the silicon nitride film 61 employed as a mask. Thus, the gate electrodes 7A (word lines WL) of memory-cell selecting MISFETs Qs are formed in the DRAM forming area.

Subsequently, the ions of an n-type impurity (for example, phosphorus) are implanted into the pr type well 3 in the DRAM forming area, thereby to form n-type semiconductor regions 11 which make up the source and drain of each memory-cell selecting MISFET Qs. Owing to the steps thus far explained, there are substantially finished those memory-cell selecting MISFET Qs of a DRAM, each of which has the gate electrode 7A of poly-cide structure including the polycrystal silicon film 7 and the Co silicide layer 20.

Figure 46:
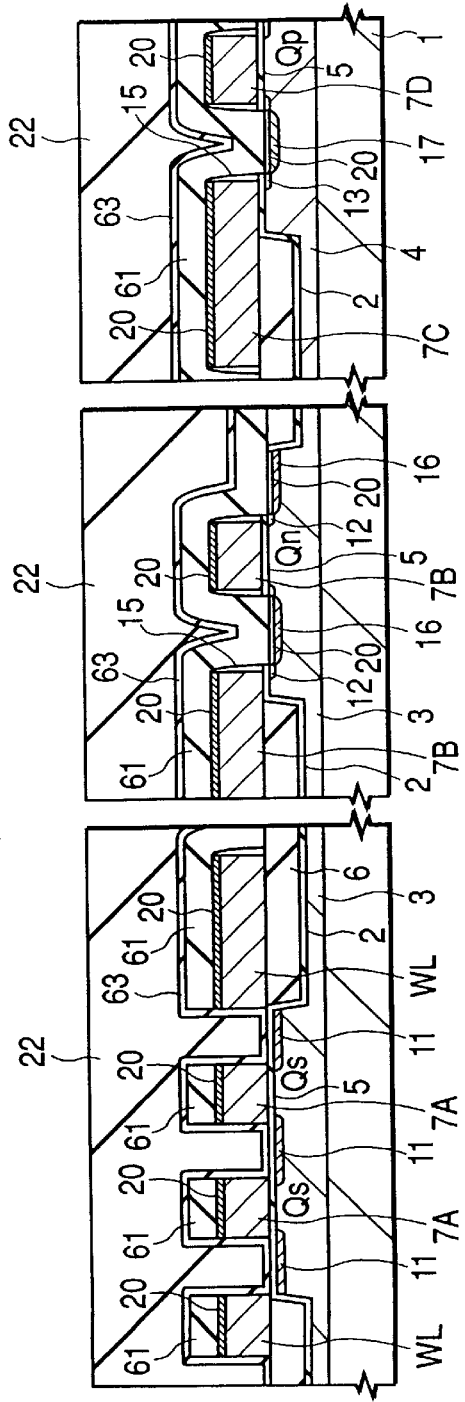
FIG. 46 is a sectional view of the essential portions of the semiconductor substrate showing the method of manufacturing the system LSI in Embodiment 3 of the present invention.

Next, as shown in FIG. 46, a silicon nitride film 63 is deposited on the semiconductor substrate 1 by CVD. Subsequently, a silicon oxide film 22 is deposited on the silicon nitride film 63 by CVD, and the surface of the silicon oxide film 22 is flattened by CMP.

Figure 47:
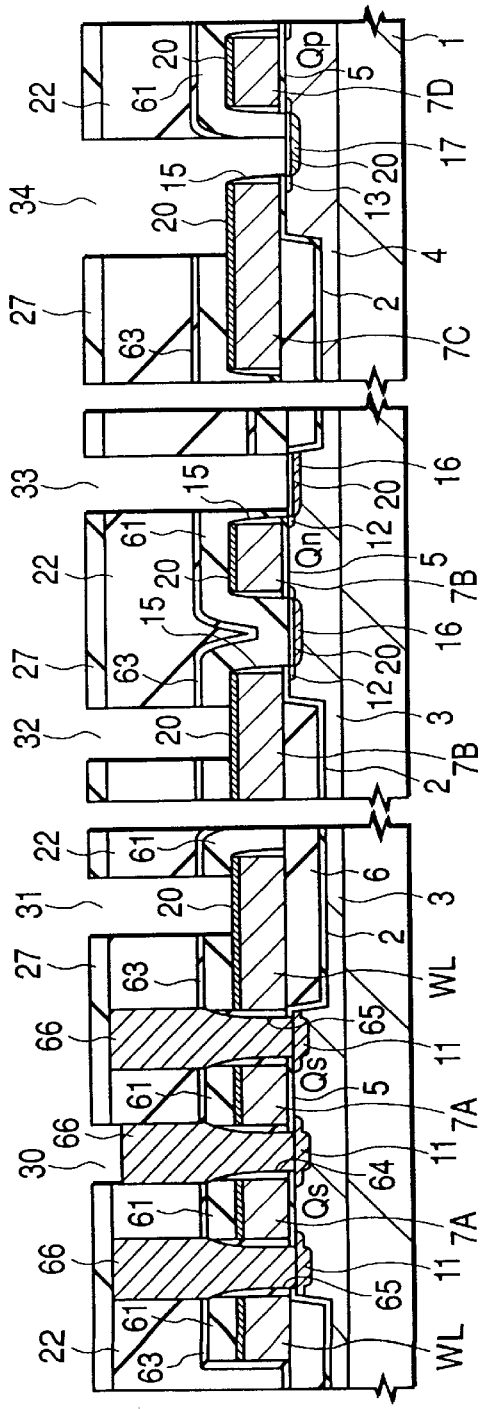
FIG. 47 is a sectional view of the essential portions of the semiconductor substrate showing the method of manufacturing the system LSI in Embodiment 3 of the present invention.

Next, as shown in FIG. 47, the same processes as in Embodiment 2 are used to form contact holes 64, 65 on the sources and drains (n-type semiconductor regions 11) of the memory-cell selecting MISFETs Qs, and to subsequently form plugs 66 comprised of a polycrystal silicon film in the contact holes 64, 65. Thereafter, the silicon oxide film 27 and the silicon oxide film 22 are etched with a photoresist film used as a mask, followed by the etching of the silicon nitride films 63, 61. Thus, a contact hole 31 is formed on the wiring lead-out area of the word line WL, contact holes 32, 33 are respectively formed on the gate electrode 8B and the $n^+$-type semiconductor region 16 of the n-channel MISFET Qn, and a contact hole 34 is formed on an area which extends over the gate electrode 8C of the drive MISFET Qd and the $p^+$-type semiconductor region 17 of the load MISFET Qp. The succeeding steps are substantially the same as in Embodiment 2.

According to Embodiment 3, the same effects as those of Embodiment 2 are attained. Moreover, the formation of the gate electrodes 7A~7D of poly-cide structure is executed simultaneously with the silicidation of the surfaces of the sources and drains ($n^+$-type semiconductor regions 16, $p^+$-type semiconductor regions 17), so that the overall process can be simplified.

Thus far, the invention made by the inventors has been concretely described on the basis of the embodiments thereof. Needless to say, however, the present invention is not restricted to the foregoing embodiments, but it is variously alterable within a scope not departing from the purport thereof.

An effect which is attained by a typical exemplary aspect of performance of the present invention is briefly explained as follows:

According to the present invention, in the manufacture of a semiconductor integrated circuit device wherein both a DRAM and a logic LSI are mounted, the gate-SAC technique of the DRAM and the L-SAC technique of the logic LSI can be made compatible. It is therefore permitted to manufacture the articles of a system LSI in which both a dram of large memory capacity and a logic LSI of high performance are mounted, at good available percentage.

What is claimed is:

1. A method of manufacturing a semiconductor integrated circuit device, comprising the steps of (a) forming a plurality of first gate electrodes comprised of a first conductor layer, and a first insulator layer covering the first gate electrodes, in a first area of a principal surface of a semiconductor substrate, forming a plurality of second gate electrodes comprised of the first conductor layer in a second area of the principal surface of the semiconductor substrate, and further forming a plurality of semiconductor regions in a third area of said principal surface of said semiconductor substrate; (b) forming a second insulator layer on said principal surface of said semiconductor substrate, and forming a third insulator layer on the second insulator layer; (c) forming a first opening in parts of the third insulator layer and said second insulator layer which cover a first space area lying between the respectively adjacent first gate electrodes formed in the first area of said principal surface, to expose a surface part of said semiconductor substrate which corresponds to the first space area; and (d) forming a second opening in parts of said third insulator layer and said second insulator layer which cover each of the plurality of second gate electrodes formed in the second area of said principal surface, to expose a surface of said each second gate electrode, and forming a third opening in parts of said third insulator layer and said second insulator layer which cover each of the plurality of semiconductor regions formed in the third area of said principal surface, to expose a surface of said each semiconductor region;

wherein the first insulator layer is not formed on said plurality of second gate electrodes at the step (a), and the first opening is formed in self-alignment with said respectively adjacent first gate electrodes at the step (c).

2. A method of manufacturing a semiconductor integrated circuit device according to claim 1, wherein each of said first insulator layer and said second insulator layer is an insulator film based on silicon nitride, and said third insulator layer is an insulator film based on silicon oxide.

3. A method of manufacturing a semiconductor integrated circuit device according to claim 1, wherein the step of forming said first opening includes the step of etching said third insulator layer under conditions adapted to heighten an etching rate of said third insulator layer relative to that of said second insulator layer, followed by anisotropic etching of said second insulator layer, thereby to form first side wall spacers on side walls of each of said first gate electrodes.

4. A method of manufacturing a semiconductor integrated circuit device according to claim 1, further comprising the step of forming a second conductor layer inside said first opening.

5. A method of manufacturing a semiconductor integrated circuit device according to claim 4, wherein said step of forming the second conductor layer inside said first opening includes the step of forming said second conductor layer on said third insulator layer with the interior of said first opening included, and the step of selectively removing said second conductor layer lying on said third insulator layer, so as to leave said second conductor layer behind within said first opening only.

6. A method of manufacturing a semiconductor integrated circuit device according to claim 1, further comprising the step of forming a third conductor layer inside the second opening and the third opening.

7. A method of manufacturing a semiconductor integrated circuit device according to claim 6, wherein the step of forming the second conductor layer and the third conductor layer includes the step of forming said third conductor layer on said third insulator layer with the interiors of said second opening and said third opening included, and the step of selectively removing said third conductor layer lying on said third insulator layer, so as to leave said third conductor layer behind within said second opening and said third opening only.

8. A method of manufacturing a semiconductor integrated circuit device according to claim 1, wherein at the step (d), the second opening is formed in self-alignment with said each second gate electrode.

9. A method of manufacturing a semiconductor integrated circuit device according to claim 8, wherein the step of forming said second opening includes the step of etching said third insulator layer under conditions adapted to heighten an etching rate of said third insulator layer relative to that of said second insulator layer, followed by anisotropic etching of said second insulator layer, to form second side wall spacers on side walls of each of said second gate electrodes.

10. A method of manufacturing a semiconductor integrated circuit device according to claim 1, comprising the step of forming an element isolating insulator film at selected parts of said third area so as to surround the respective semiconductor regions, in advance of the step (a).

11. A method of manufacturing a semiconductor integrated circuit device according to claim 10, wherein said step of forming the element isolating insulator film includes the step of forming grooves in said principal surface of said semiconductor substrate, and depositing a material of said element isolating insulator film on the surface of said semiconductor substrate with the interiors of the grooves included, and the step of selectively removing the material of said element isolating insulator film lying on said surface of said semiconductor substrate, so as to leave said material behind within said grooves only.

12. A method of manufacturing a semiconductor integrated circuit device according to claim 1, wherein the step of forming said third insulator layer includes the step of depositing a material of said third insulator layer on said second insulator layer, and polishing a surface of the material of said third insulator layer chemically and mechanically.

13. A method of manufacturing a semiconductor integrated circuit device according to claim 1, further comprising the step of forming a silicide layer on the surface of said each semiconductor region of said third area.

14. A method of manufacturing a semiconductor integrated circuit device according to claim 1, further comprising the step of forming said first conductor layer and said first insulator layer on said principal surface of said semiconductor substrate in advance of said step (a).

15. A method of manufacturing a semiconductor integrated circuit device including a first memory cell area in which memory cells each having a first MISFET and a capacitor connected in series are arranged in a matrix shape, and a second circuit area in which a plurality of second MISFETs are formed, comprising the steps of:

(a) forming a first conductor layer on a principal surface of a semiconductor substrate, and selectively patterning that part of the first conductor layer which lies in the second circuit area, to form gate electrodes of the second MISFETs in said second circuit area and to leave said first conductor layer in the first memory cell area;

(b) forming a first insulator layer on the principal surface of the semiconductor substrate, and selectively patterning parts of the first insulator layer and said first conductor layer which lie in said first memory cell area, to form gate electrodes of the first MISFETs as are covered with said first insulator layer, in said first memory cell area, and to leave said first insulator layer behind in said second circuit area;

(c) forming a second insulator layer on said principal surface of said semiconductor substrate, and forming a third insulator layer on the second insulator layer;

(d) forming a first opening in parts of the third insulator layer and said second insulator layer which cover a spacial area lying between the respectively adjacent gate electrodes of said first MISFETs, in self-alignment with said respectively adjacent gate electrodes of said first MISFETs, thereby to expose a surface of a source or drain of each of said first MISFETs; and (e) forming a second opening in parts of said third insulator layer and said second insulator layer which cover the gate electrode of each of said second MISFETs, thereby to expose a surface of said gate electrode of said each second MISFET, and forming a third opening in parts of said third insulator layer and said second insulator layer which cover a source or drain of said each second MISFET, thereby to expose a surface of the source or drain of said each second MISFET.

16. A method of manufacturing a semiconductor integrated circuit device according to claim 15, wherein an element isolating insulator film is formed at selected parts of said second circuit area so as to surround the respective second MISFETs, in advance of the step (a).

17. A method of manufacturing a semiconductor integrated circuit device according to claim 15, wherein each of said first insulator layer and said second insulator layer is an insulator film based on silicon nitride, and said third insulator layer is an insulator film based on silicon oxide.

18. A method of manufacturing a semiconductor integrated circuit device according to claim 15, wherein the step of forming the first opening includes the step of etching said third insulator layer under conditions adapted to heighten an etching rate of said third insulator layer relative to that of said second insulator layer, followed by anisotropic etching of said second insulator layer, thereby to form side wall spacers on side walls of each of said gate electrodes of said first MISFETs.

19. A method of manufacturing a semiconductor integrated circuit device according to claim 15, wherein the step of forming said third insulator layer includes the step of depositing a material of said third insulator layer on said second insulator layer, and subsequently polishing a surface of the material of said third insulator layer chemically and mechanically.

20. A method of manufacturing a semiconductor integrated circuit device according to claim 15, further comprising the step of forming a second conductor layer inside said first opening.

21. A method of manufacturing a semiconductor integrated circuit device according to claim 20, wherein said step of forming the second conductor layer inside said first opening includes the step of forming said second conductor layer on said third insulator layer with the interior of said first opening included, and the step of selectively removing said second conductor layer lying on said third insulator layer, so as to leave said second conductor layer within said first opening.

22. A method of manufacturing a semiconductor integrated circuit device according to claim 20, further comprising the step of forming on said third insulator layer a capacitor which is electrically connected with the source or drain of said each first MISFET through the second conductor layer.

23. A method of manufacturing a semiconductor integrated circuit device according to claim 22, wherein said step of forming the capacitor includes the step of forming on said third insulator layer a first electrode which is electrically connected with said second conductor layer, the step of forming a dielectric film of said capacitor on the first electrode, and the step of forming a second electrode on the dielectric film.

24. A method of manufacturing a semiconductor integrated circuit device according to claim 15, further comprising the step of forming a third conductor layer inside the second opening and the third opening.

25. A method of manufacturing a semiconductor integrated circuit device according to claim 24, wherein said step of forming the third conductor layer includes the step of forming said third conductor layer on said third insulator layer with the interiors of said second opening and said third opening included, and the step of selectively removing said third conductor layer lying on said third insulator layer, so as to leave said third conductor layer within said second opening and said third opening only.

26. A method of manufacturing a semiconductor integrated circuit device according to claim 15, further comprising the step of forming a silicide layer on the surface of said source or drain of said each second MISFET.

27. A method of manufacturing a semiconductor integrated circuit device according to claim 15, wherein said plurality of second MISFETs include n-channel MISFETs and p-channel MISFETs.

28. A method of manufacturing a semiconductor integrated circuit device according to claim 15, further comprising the step of forming a third conductor layer on said third insulator layer, and subsequently patterning the third conductor layer, thereby to form a bit line which is electrically connected with the source or drain of said each first MISFET through the first opening, to form a first wiring line which is electrically connected with said gate electrode of said each second MISFET through the second opening, and to form a second wiring line which is electrically connected with said source or drain of said each second MISFET through the third opening.

29. A method of manufacturing a semiconductor integrated circuit device including a first memory cell area in which memory cells each having a first MISFET and a capacitor connected in series are arranged in a matrix shape, and a second circuit area in which a plurality of second MISFETs are formed, comprising the steps of:

(a) forming a first conductor layer on a principal surface of a semiconductor substrate, and patterning the first conductor layer, to form gate electrodes of the second MISFETs in the second circuit area and to leave said first conductor layer in the first memory cell area;

(b) forming side wall spacers on side walls of each of the gate electrodes of said second MISFETs;

(c) forming semiconductor regions to make up a source and drain of each of said second MISFETs, in those parts of the semiconductor substrate which lie on both sides of the gate electrode of said each second MISFET;

(d) forming a refractory metal layer on the principal surface of said semiconductor substrate, and subsequently heat-treating said semiconductor substrate, thereby to form a silicide layer on surfaces of said gate electrode and the source and drain of said each second MISFET and on a surface of said first conductor layer left in said first memory cell area;

(e) forming a first insulator layer on said principal surface of said semiconductor substrate, and selectively patterning parts of the first insulator layer and said first conductor layer which lies in said first memory cell area, to form gate electrodes of the first MISFETs as are covered with said first insulator layer, in said first memory cell area, and to leave said first insulator layer in said second circuit area;

(f) forming a second insulator layer on said principal surface of said semiconductor substrate, and also forming a third insulator layer on the second insulator layer;

(g) forming a first opening in those parts of the third insulator layer and said second insulator layer which cover a spacial area lying between the respectively adjacent gate electrodes of said first MISFETs, in self-alignment with said respectively adjacent gate electrodes of said first MISFETs, to expose a surface of a source or drain of each of said first MISFETs; and (h) forming a second opening in those parts of said third insulator layer and said second insulator layer which cover said gate electrode of said each second MISFETs, to expose the surface of said gate electrode of said each second MISFET, and forming a third opening in parts of said third insulator layer and said second insulator layer which cover a source or drain of said each second MISFET, to expose a surface of the source or drain of said each second MISFET.

30. A method of manufacturing a semiconductor integrated circuit device according to claim 29, comprising the step of forming an element isolating insulator film at selected parts of said second circuit area so as to surround the respective MISFETs, in advance of the step (a).

31. A method of manufacturing a semiconductor integrated circuit device according to claim 29, wherein each of said first insulator layer and said second insulator layer is an insulator film based on silicon nitride, and said third insulator layer is an insulator film based on silicon oxide.

32. A method of manufacturing a semiconductor integrated circuit device according to claim 29, wherein the step of forming said first opening includes the step of etching said third insulator layer under conditions adapted to heighten an etching rate of said third insulator layer relative to that of said second insulator layer, followed by anisotropic etching of said second insulator layer, to form side wall spacers on side walls of each of said gate electrodes of said first MISFETs.

33. A method of manufacturing a semiconductor integrated circuit device according to claim 29, further comprising the step of forming a second conductor layer inside said first opening.

34. A method of manufacturing a semiconductor integrated circuit device according to claim 29, further comprising the step of forming on said third insulator layer a capacitor which is electrically connected with the source or drain of said each first MISFET through the second conductor layer.

35. A method of manufacturing a semiconductor integrated circuit device according to claim 29, further comprising the step of forming a third conductor layer on said third insulator layer, and subsequently patterning the third conductor layer, thereby to form a bit line which is electrically connected with the source or drain of said each first MISFET through the first opening, to form a first wiring line which is electrically connected with said gate electrode of said each second MISFET through the second opening, and to form a second wiring line which is electrically connected with said source or drain of said each second MISFET through the third opening.

36. A method of manufacturing a semiconductor integrated circuit device according to claim 29, wherein the refractory metal layer contains an element selected from the group consisting of cobalt and titanium.

* * * * *